(12) United States Patent
Loechelt et al.

(10) Patent No.: US 8,928,050 B2
(45) Date of Patent: Jan. 6, 2015

(54) ELECTRONIC DEVICE INCLUDING A SCHOTTKY CONTACT

(71) Applicants: Gary H. Loechelt, Tempe, AZ (US); Prasad Venkatraman, Gilbert, AZ (US); Zia Hossain, Tempe, AZ (US); Gordon M. Grivna, Mesa, AZ (US)

(72) Inventors: Gary H. Loechelt, Tempe, AZ (US); Prasad Venkatraman, Gilbert, AZ (US); Zia Hossain, Tempe, AZ (US); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/794,103

(22) Filed: Mar. 11, 2013

(65) Prior Publication Data

US 2014/0252484 A1    Sep. 11, 2014

(51) Int. Cl.
*H01L 29/76* (2006.01)
*H01L 27/02* (2006.01)

(52) U.S. Cl.
CPC .................................. *H01L 27/0255* (2013.01)
USPC .............. 257/288; 257/E29.04; 257/E29.066; 257/E29.136

(58) Field of Classification Search
USPC ........................ 257/E29.04, E29.066, E29.136
See application file for complete search history.

(56) References Cited

U.S. PATENT DOCUMENTS

| | | | |
|---|---|---|---|
| 4,760,035 A * | 7/1988 | Pfleiderer et al. | ............. 438/200 |
| 4,811,065 A | 3/1989 | Cogan | |
| 4,823,172 A | 4/1989 | Mihara | |
| 6,351,018 B1 | 2/2002 | Sapp | |
| 7,745,846 B2 | 6/2010 | Korec et al. | |
| 8,222,695 B2 | 7/2012 | Loechelt et al. | |
| 8,299,560 B2 * | 10/2012 | Loechelt et al. | ............... 257/499 |
| 2004/0135248 A1 | 7/2004 | Takagawa et al. | |
| 2006/0261384 A1 * | 11/2006 | Rueb et al. | ..................... 257/288 |
| 2008/0299751 A1 | 12/2008 | Quddus et al. | |
| 2010/0244089 A1 | 9/2010 | Chen | |
| 2011/0156682 A1 | 6/2011 | Girdhar et al. | |

OTHER PUBLICATIONS

J. Roig et al., "Improved Trench-Based Power Rectifiers for High-Temperature Smart-Power Applications," IEEE Electron Device Letters, vol. 30, No. 12, Dec. 2009. 4 pgs.

J. Roig et al., "High-Voltage Trenched Rectifiers for Smart Power Technology," in Proc. ESSDERC, 2008, pp. 63-66.

\* cited by examiner

*Primary Examiner* — Kevin M Picardat
*Assistant Examiner* — Paul Patton
(74) *Attorney, Agent, or Firm* — Abel Law Group, LLP

(57) ABSTRACT

An electronic device can include a semiconductor layer having a primary surface, and a Schottky contact comprising a metal-containing member in contact with a horizontally-oriented lightly doped region within the semiconductor layer and lying adjacent to the primary surface. In an embodiment, the metal-containing member lies within a recess in the semiconductor layer and contacts the horizontally-oriented lightly doped region along a sidewall of the recess. In other embodiment, the Schottky contact may not be formed within a recess, and a doped region may be formed within the semiconductor layer under the horizontally-oriented lightly doped region and have a conductivity type opposite the horizontally-oriented lightly doped region. The Schottky contacts can be used in conjunction with power transistors in a switching circuit, such as a high-frequency voltage regulator.

19 Claims, 22 Drawing Sheets

US 8,928,050 B2

ELECTRONIC DEVICE INCLUDING A SCHOTTKY CONTACT

FIELD OF THE DISCLOSURE

The present disclosure relates to electronic devices and processes of forming electronic devices, and more particularly to, electronic devices including Schottky contacts and processes of forming the same.

RELATED ART

An insulated gate field-effect transistor (IGFET) is a common type of transistor that can be used in a power switching circuit. An IGFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When changing states of the power switching circuit, periods of dead time can occur when current cannot readily flow through the circuit, and charge accumulates in the switching devices. Once a change of state occurs, the removal of this accumulated charge can create voltage spikes within the power switching circuit that may exceed the drain-to-source breakdown voltage of one of the IGFETs. To reduce the likelihood of an over-voltage situation, a Schottky contact can be used to help reduce charge that can accumulate during a period of dead time. Dead time refers to a brief period in a switching cycle when all switching devices are off or in a non-current conducting state. Referring briefly to US 2011/0156682, a Schottky contact can be formed where a metal silicide structure contacts an N-type epitaxial layer. Current flows vertically from an N+ semiconductor substrate through the N-type epitaxial layer to the metal silicide structure. The power switching circuit will not have optimal performance, as compromises are made when designing such a device.

BRIEF DESCRIPTION OF THE DRAWINGS

Embodiments are illustrated by way of example and are not limited in the accompanying figures.

Figure 1:
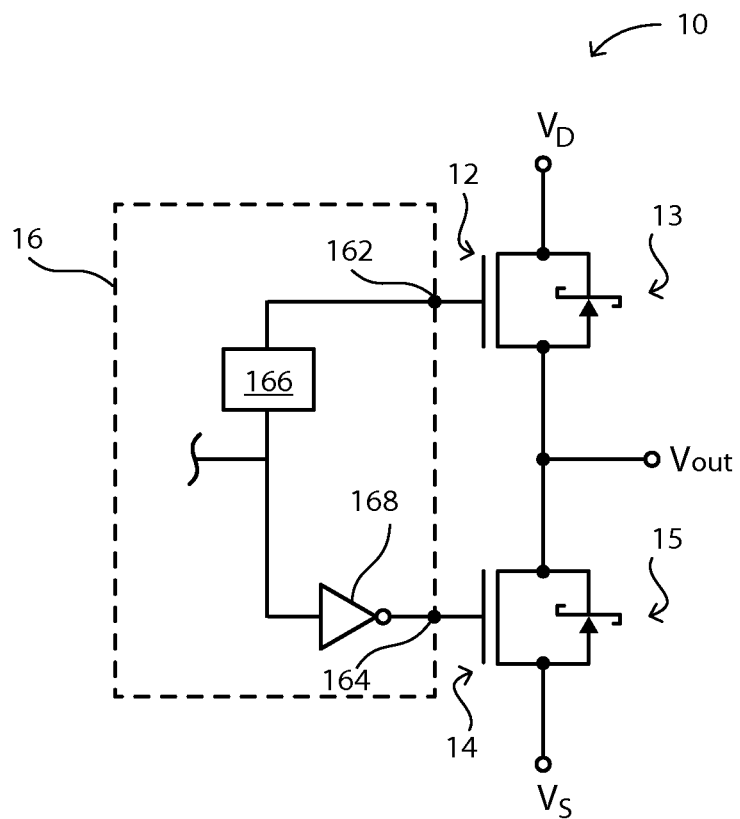
FIG. 1 includes a schematic diagram of an electronic device that includes a switching circuit.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Schottky contacts can be formed with power transistors to reduce the amount of charge accumulated during dead time in the switching cycle. This reduction in accumulated charge may help to reduce ringing at an output node of a switching circuit or to otherwise help to reduce adverse effects during transient times when power transistors within the switching circuits are switched. The Schottky contacts can be integrated within an existing process flow with little if any change in the process flow and can occupy a relatively small amount of areas as compared to the power transistors. The electronic device including the switching circuit may be implemented on a single die or may be implemented in a plurality of dies that are coupled to each other. Embodiments are described below and are meant to illustrate and not limit the scope of the present invention.

FIG. 1 includes a circuit diagram of an electronic device 10. In the embodiment as illustrated in FIG. 1, the electronic device 10 can include a power switching circuit. The electronic device 10 includes a high-side transistor 12, wherein a drain region of the high-side transistor 12 is coupled to a terminal, such as $V_D$, and a source region of the high-side transistor 12 is coupled to a terminal, such as $V_{out}$. The electronic device 10 also includes a low-side transistor 14, wherein a drain region of the transistor low-side 14 is coupled to the source region of the high-side transistor 12, and a source region of the low-side transistor 14 is coupled to a terminal, such as $V_S$. A Schottky diode 13 is electrically connected in parallel with the high-side transistor 12, and the Schottky diode 15 is electrically connected in parallel with the low-side transistor 14. The gate electrodes of the transistors 12 and 14 can be coupled to control terminals 162 and 164 of a control unit 16. An inverter 168 can be used to invert the signal of the control unit 16 when configured to receive a single signal to control both transistors 12 and 14. This inverter may include other circuitry to maintain a small dead time, or brief period when both transistors 12 and 14 are off or in a non-current conducting state. An intentional dead time may be desirable to substantially prevent an electrical short from $V_D$ to $V_S$, which would occur if both transistors 12 and 14 happened to be simultaneously on or in a current conducting state. If needed or desired, a circuit 166 can be used to raise the voltage sufficiently high for the gate electrode for the high-side transistor 12 when the high-side transistor 12 is on and the low-side transistor 14 is off. The circuit 166 can include a charge pump or another similar circuit that may further include a Schottky diode connecting a control voltage supply (not illustrated in FIG. 1) to the control circuitry for the gate electrode for the high-side transistor 12. In a particular embodiment, the control unit 16 can be configured such that only one of the transistors 12 and 14 is enabled at any particular point in time. When the high-side transistor 12 is enabled (and the low-side transistor 14 is disabled), $V_{out}$ will be substantially $V_D$, and when the low-side transistor 14 is enabled (and the high-side transistor 12 is disabled), $V_{out}$ will be substantially $V_S$. The control unit 16 can be used to determine when and how frequently $V_{out}$ will be switched from $V_S$ to $V_D$, and vice versa. In a more particular embodiment, the transistors 12 and 14 can be power switching transistors within a high-frequency voltage regulator.

Physical structures corresponding to the transistors 12 and 14 and Schottky diodes 13, 15, and within the circuit 166 and processes of forming such physical structures are described below. In the description below, each of the transistors 12 and 14 may include one or more transistor structures. Transistor structures that are part of the high-side transistor 12 may be referred to as high-side transistor structures, and transistor structures that are part of the low-side transistor 14 may be referred to as low-side transistor structures. Each of the Schottky diodes 13 and 15 may include one or more Schottky contacts. In an embodiment, the transistors 12 and 14 and Schottky diodes 13 and 15 will be part of the same integrated circuit. In a particular embodiment, the control unit 16 is on the same integrated circuit as the transistors 12 and 14 and Schottky diodes.

Figure 2:
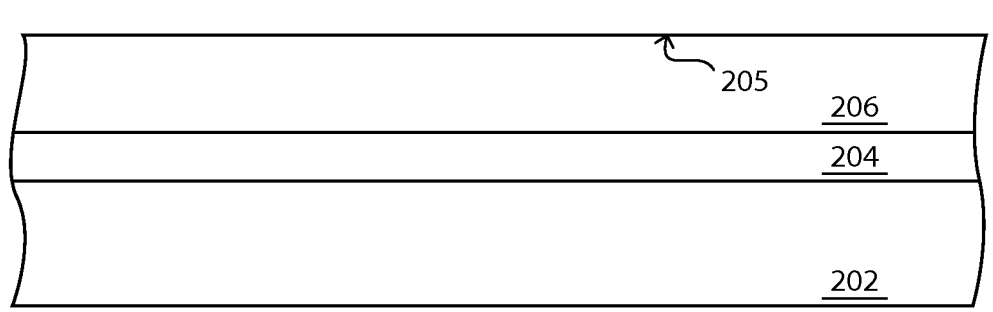
FIG. 2 includes an illustration of a cross-sectional view of a portion of a workpiece including a buried conductive region, a buried insulating layer, and a semiconductor layer.

FIG. 2 includes an illustration of a cross-sectional view of a portion of a workpiece 200 that includes a buried conductive region 202, a buried insulating layer 204, and a semiconductor layer 206. The buried conductive region 202 can include a Group 14 element (i.e., carbon, silicon, germanium, or any combination thereof) and can be heavily n-type or p-type doped. For the purposes of this specification, heavily doped is intended to mean a peak dopant concentration of at least $1\times10^{19}$ atoms/cm$^3$, and lightly doped is intended to mean a peak dopant concentration of less than $1\times10^{19}$ atoms/cm$^3$. The buried conductive region 202 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 202. In an embodiment, the buried conductive region 202 is heavily doped with an n-type dopant, such as phosphorus, arsenic, antimony, or any combination thereof. In a particular embodiment, the buried conductive region 202 includes arsenic or antimony if diffusion of the buried conductive region 202 is to be kept low, and in a particular embodiment, the buried conductive region 202 includes antimony to reduce the level of autodoping (as compared to arsenic) during formation of a subsequently-formed semiconductor layer. The buried conductive region 202 will be used to electrically connect the source of the high-side transistor and the drain of the low-side transistor together and be part of an output node for the electronic device.

The buried insulating layer 204 is disposed over the buried conductive region 202. During normal operation, the buried insulating layer 204 helps to isolate the voltage on the buried conductive region 202 from portions of the semiconductor layer 206. The buried insulating layer 204 can include an oxide, a nitride, or an oxynitride. The buried insulating layer 204 can include a single film or a plurality of films having the same or different compositions. In an embodiment, the buried insulating layer 204 can have a thickness of at least approximately 0.2 micron, and in a further embodiment, the buried insulating layer 204 may have a thickness no greater than approximately 5.0 microns. In a particular embodiment, the buried insulating layer 204 has a thickness in a range of approximately 0.5 micron to approximately 0.9 micron.

The semiconductor layer 206 is disposed over the buried insulating layer 204 and has a primary surface 205 where the transistor structures and other electronic components (not illustrated) will be subsequently formed. The semiconductor layer 206 can include a Group 14 element and any of the dopants as described with respect to the buried conductive region 202 or dopants of the opposite conductivity type. In an embodiment, the semiconductor layer 206 is a lightly doped n-type or p-type epitaxial silicon layer having a thickness in a range of approximately 0.2 micron to approximately 5.0 microns, and a doping concentration no greater than approximately $1\times10^{17}$ atoms/cm$^3$, and in another embodiment, a doping concentration of at least approximately $1\times10^{14}$ atoms/cm$^3$. The semiconductor layer 206 may be disposed over all of the workpiece 200. The dopant concentration within the semiconductor layer 206 as formed or before selectively doping regions within the semiconductor layer 206 will be referred to as the background dopant concentration.

Figure 3:
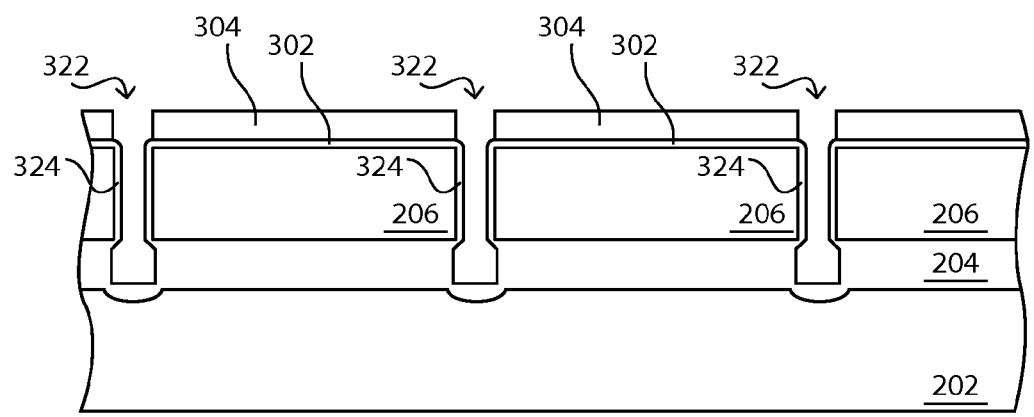
FIG. 3 includes an illustration of a cross-sectional view of the workpiece of FIG. 2 after forming a pad layer, a stopping layer, and etching the semiconductor layer and the buried insulating layer to define trenches.

Referring to FIG. 3, a pad layer 302 and a stopping layer 304 (e.g., a polish-stop layer or an etch-stop layer) are sequentially formed over the semiconductor layer 206 using a thermal growth technique, a deposition technique, or a combination thereof. Each of the pad layer 302 and the stopping layer 304 can include an oxide, a nitride, an oxynitride, or any combination thereof. In an embodiment, the pad layer 302 has a different composition as compared to the stopping layer 304. In a particular embodiment, the pad layer 302 includes an oxide, and the stopping layer 304 includes a nitride.

A patterned masking layer (not illustrated) is formed over the stopping layer 304. Trenches 322 within the semiconductor layer 206 and the buried insulating layer 204 are formed where vertical conductive structures will be formed. In a particular embodiment, exposed portions of the pad layer 302, stopping layer 304, the semiconductor layer 206, and the buried insulating layer 204 are removed. Anisotropic etching techniques are used to form the structures as illustrated in the embodiment of FIG. 3. In another embodiment, substantially none of the buried insulating layer 204 is removed, and in another embodiment, only part or substantially all of the thickness of the buried insulating layer 204 disposed under the openings is removed. In a particular embodiment, the width of each of the trenches 322 is at least approximately 0.05 micron or approximately 0.1 micron, and in another particular embodiment, the width of each of the trenches 322 is no greater than approximately 2 microns or approximately 1 micron. The patterned masking layer can be removed after forming the trenches 322.

Insulating spacers 324 can be formed within the trenches 322. The insulating spacers 324, which can also be referred to as insulating liners, can help to electrically insulate the semiconductor layer 206 from vertical conductive structures that will be subsequently formed within the trenches 322. In the embodiment as illustrated, a thermal oxidation can be performed to form the insulating spacers 324. In another embodiment (not illustrated), an insulating layer can be conformally deposited and anisotropically etched to form the insulating spacers. The insulating spacers 324 have a width in a range of approximately 20 nm to approximately 200 nm.

Figure 4:
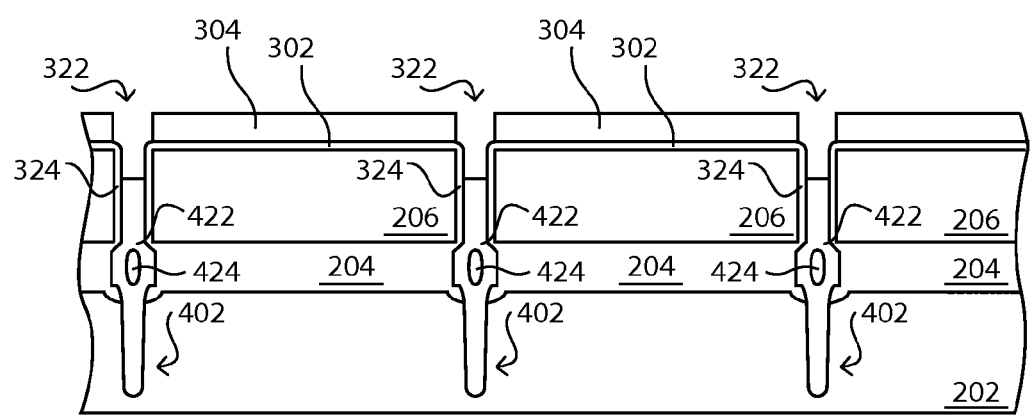
FIG. 4 includes an illustration of a cross-sectional view of the workpiece of FIG. 3 after forming conductive plugs within the trenches.

FIG. 4 includes an illustration after extending the trenches and forming conductive plugs 422. Before forming the conductive plugs 422, any remaining insulating material, such as oxide, along the bottoms of the trenches 322 (as illustrated in FIG. 3) can be removed, and the trenches 322 can be extended into the buried conductive region 202 to form the trench extensions 402. In an embodiment, the trench extensions 402 may be at least approximately 0.2 micron into the buried conductive region 202, and in another embodiment, the trench extensions 402 may be at least approximately 0.3 micron. In a further embodiment, the trench extensions 402 may be no greater than approximately 5.0 micron, and in still a further embodiment no greater than approximately 2.0 microns. In another embodiment, the trench extensions may be deeper or shallower than described above. The removal of the insulating material and forming the trench extensions 402 can be performed using an anisotropic etch technique.

A conductive layer is formed over the stopping layer 304 and within the trenches 322, and, in a particular embodiment, the conductive layer substantially fills the trenches 322. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application. During the formation of the conductive layer, voids 424 may form within the trenches 322. In another embodiment, within trench 322, voids within the conductive layer may be formed along centerlines of such trenches 322.

A portion of the conductive layer that is disposed over the stopping layer 304 is removed to form the conductive plugs 422 within the trenches 322, as illustrated in the embodiment of FIG. 4. A continued etch or other removal operation can be used to recess the conductive plugs 422 further into the trenches 322, as illustrated in FIG. 4, if needed or desired.

Figure 5:
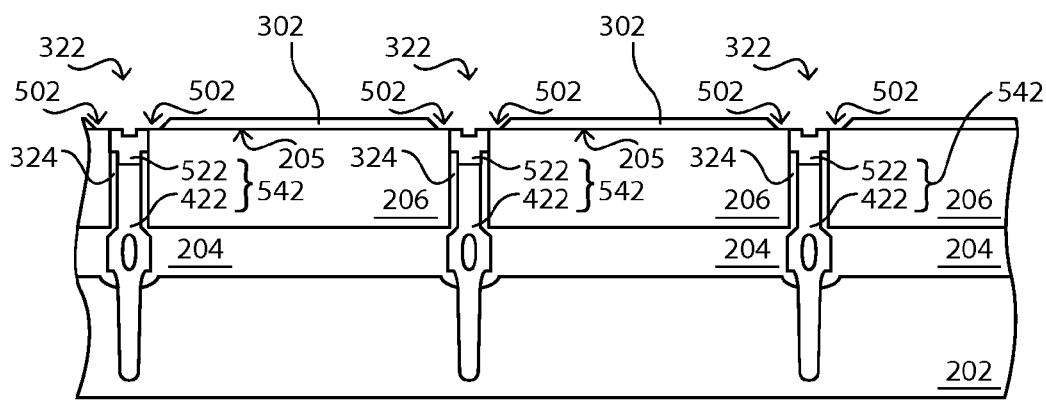
FIG. 5 includes an illustration of a cross-sectional view of the workpiece of FIG. 4 after forming conductive plugs over the previously-formed conductive plugs to form vertical conductive regions.

Referring to FIG. 5, while portions of the stopping layer 304 are present (not illustrated in FIG. 5), the pad layer 302 is etched and undercuts part of the stopping layer 304 to expose portions of the semiconductor layer 206 near the trenches 322. At this point in the embodiment as illustrated on FIG. 4, an additional etch of the trench fill material may be performed exposing the upper surface of the insulating spacers 324. Exposed portions of the insulating spacers 324 are etched, and remaining portions of the stopping layer 304 are then removed. Conductive plugs 522 are formed within the trenches and help to electrically connect the conductive plugs 422 to doped regions that will be subsequently formed within the semiconductor layer 206. The conductive plugs 522 can be formed using any of the materials and methods of formation for the conductive plugs 422, except that the conductive plugs 522 may or may not be recessed within the trenches 322. The conductive plugs 422 and 522 may include the same material or different materials and may be formed using the same technique or different techniques. The combinations of the conductive plugs 422 and 522 can form vertical conductive regions 542. In the embodiment as illustrated, the vertical conductive regions 542 are in a form of vertical conductive structures. In an alternative embodiment in which the buried insulating layer 204 is not used (not illustrated), the vertical conductive regions 542 can be in a form of doped regions within the semiconductor layer 206 that can be formed using one or more ion implantations. The pad layer 302 may be removed at this point in the process.

Figure 6:
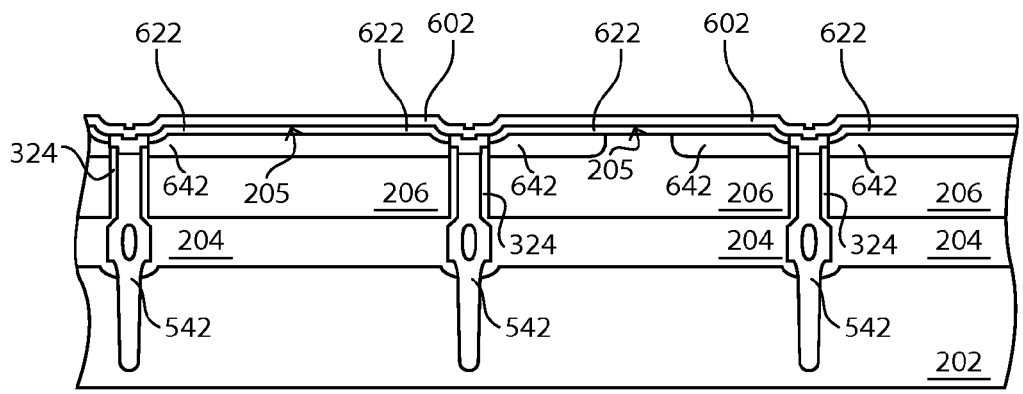
FIGS. 6 and 7 include illustrations of cross-sectional views of the workpiece of FIG. 5 after forming an implant screen layer, horizontally-oriented lightly doped regions, and resurf regions within portions of the workpiece where the high-side and low-side transistor structures are being formed.
Figure 7:
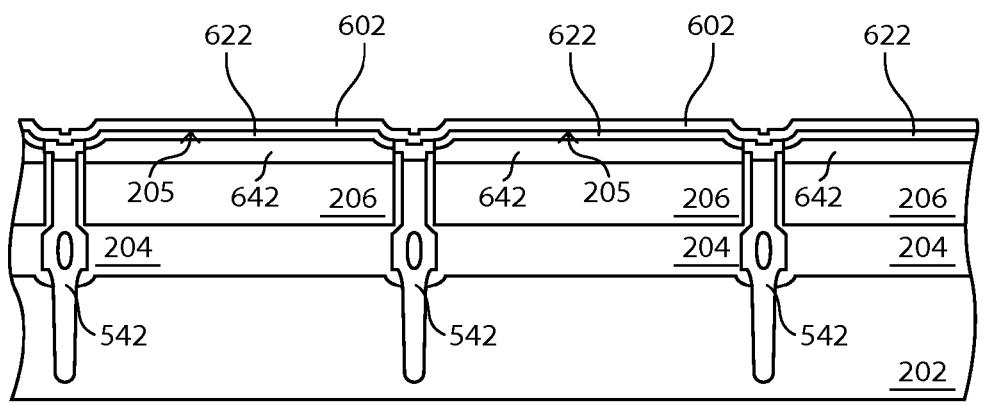

FIGS. 6 to 10 illustrate the workpiece after forming an implant screen layer 602, horizontally-oriented lightly doped regions 622, and resurf regions 642. FIG. 6 includes high-side transistor structures, FIG. 7 includes low-side transistor structures, and FIGS. 8 to 10 include portions of the workpiece where Schottky contacts will be formed. The implant screen layer 602 is formed over the primary surface 205 and can include an oxide, a nitride, or an oxynitride and may have a thickness in a range of approximately 2 nm to approximately 90 nm. The implant screen layer 602 can be formed by a thermal growth or deposition technique.

In the embodiment as illustrated in FIGS. 6 to 10, the horizontally-oriented lightly doped regions 622 can be formed over substantially all of the area where the transistor structures and where Schottky contacts are being formed. Within the power transistors, the horizontally-oriented lightly doped regions 622 can be the main portions of the drift regions of the power transistors and are parts of the drain regions. For the Schottky contacts, the horizontally-oriented lightly doped regions 622 can allow for a lower resistance current path as compared to a vertical current path that would pass through the entire thickness of the semiconductor layer 206 to the buried conductive region, if the buried insulating layer 204 would not present. In a normal operating state, charge carriers (for example, electrons) or current flows through the horizontally-oriented lightly doped regions 622 principally in a horizontal direction. If the integrated circuit includes the control unit 16, a masking layer (not illustrated) may be formed to protect part or all of the semiconductor layer where electronic components of the control unit 16, other than where Schottky contacts within the circuit 166, are being formed. The horizontally-oriented lightly doped regions 622 can have a dopant concentration of less than approximately $1 \times 10^{19}$ atoms/cm$^3$ and at least approximately $1 \times 10^{16}$ atoms/cm$^3$ and a depth in one embodiment of less than approximately 0.9 micron, and in another embodiment of less than approximately 0.5 micron.

In the embodiment as illustrated in FIGS. 6 to 10, the resurf regions 642 can be formed over substantially all of the area where the drain regions for transistor structures and the regions near the Schottky contacts. In an embodiment, resurf regions 642 are not formed where ohmic contacts will be subsequently formed for the horizontally-oriented lightly doped regions 622. The resurf regions 642 can help keep more current flowing through the horizontally-oriented lightly doped regions 622 instead of into the semiconductor layer 206 underlying the horizontally-oriented lightly doped regions 622. If the integrated circuit includes the control unit 16, a masking layer (not illustrated) may be formed to protect part or all of the semiconductor layer where electronic components of the control unit 16 are being formed. The resurf regions 642 may have a dopant concentration of no greater than approximately $5 \times 10^{17}$ atoms/cm$^3$ and at least approximately $1 \times 10^{16}$ atoms/cm$^3$ and a depth in one embodiment of less than approximately 1.5 microns, and in another embodiment of less than approximately 1.2 microns. The peak concentration of the resurf regions may be in a range of approximately 0.5 micron to approximately 0.9 micron below the primary surface 205.

In an embodiment, the horizontally-oriented lightly doped regions 622 can be formed before the resurf regions 642. In another embodiment, the horizontally-oriented lightly doped regions 622 can be formed after the resurf regions 642.

Figure 11:
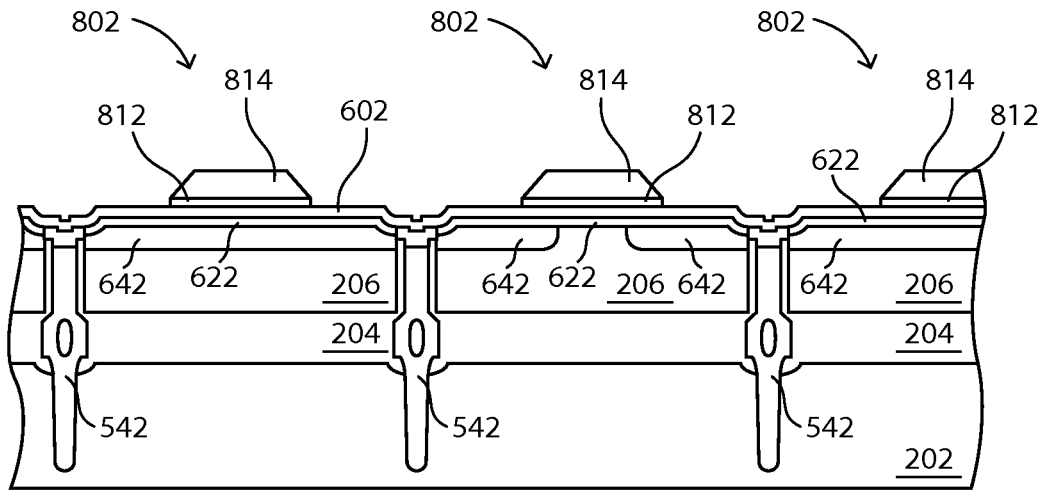
FIG. 11 includes an illustration of a cross-sectional view of the workpiece of FIG. 6 after forming insulating members.

FIG. 11 includes an illustration after insulating members 802 are formed over portions of the transistor structures and Schottky contacts that will experience the highest voltages during normal operation. Such regions generally correspond to locations where ohmic contacts will be made to the horizontally-oriented lightly doped regions 622. The insulating members 802 can help reduce the capacitive coupling between the drain regions of the transistor structures and subsequently-formed conductive electrodes and improve the breakdown voltage between the drain regions and subsequently-formed conductive electrodes. The insulating members 802 can include a single insulating layer or a plurality of insulating layers. In the embodiment as illustrated in FIG. 11, insulating layers 812 and 814 are serially formed over the workpiece, wherein the insulating layers 812 and 814 have different compositions. For example, the insulating layer 812 can include a nitride, and the insulating layer 814 can include an oxide. The insulating layer 814 can help reduce capacitive coupling, and the insulating layer 812 can be an etch stop during contact opening formation. The insulating layer 812 can have a thickness in a range of approximately 20 nm to approximately 90 nm, and the insulating layer 814 can have a thickness in a range of approximately 50 nm to approximately 500 nm.

A masking layer (not illustrated) can be formed over the insulating layer 814 and patterned to include masking features that are disposed over portions where ohmic contacts and to the horizontally-oriented lightly doped regions 622 will be subsequently formed and over the regions where the Schottky contacts will be subsequently formed. The insulating layer 814 can be etched to provide a tapered profile, and the insulating layer 812 can be etched with or without the tapered profile. The masking layer may be removed after the insulating layer 814 is etched and before or after the insulating layer 812 is etched.

Figure 8:
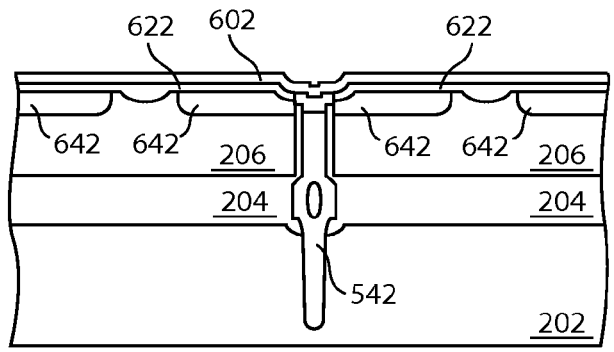
FIGS. 8, 9, and 10 include illustrations of cross-sectional views of the workpiece of FIG. 5 after forming an implant screen layer, horizontally-oriented lightly doped regions, and resurf regions within portions of the workpiece where Schottky contacts will be formed.
Figure 10:
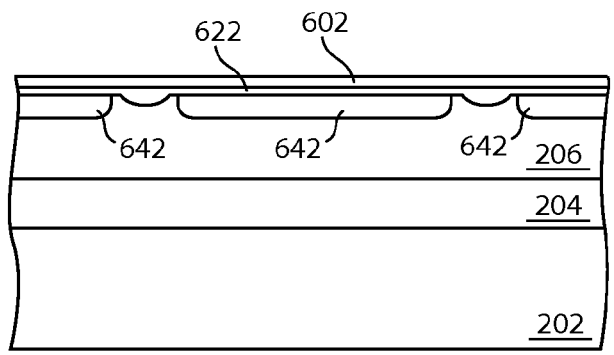
Figure 12:
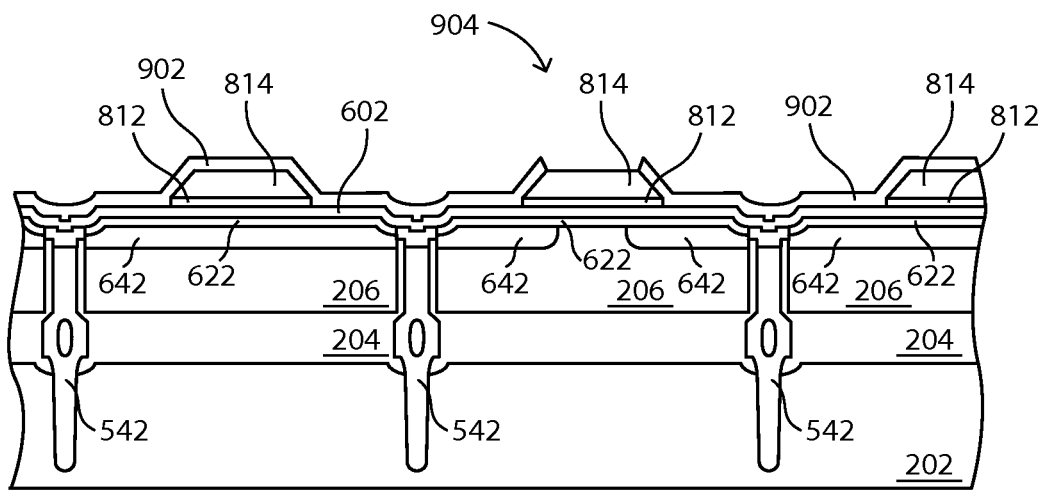
FIG. 12 includes an illustration of a cross-sectional view of the workpiece of FIG. 11 after forming a patterned conductive layer.

In FIG. 12, a conductive layer 902 is deposited over the insulating members 802 and patterned to form openings, such as an opening 904, where ohmic contact structures will be subsequently made to the horizontally-oriented lightly doped regions 622 of high-side transistor structures. In an embodiment, openings may also be formed over portions of the horizontally-oriented lightly doped regions 622 adjacent to where Schottky contacts will be subsequently formed for portions of the workpiece as illustrated in FIGS. 8 and 10. Alternatively, such openings regarding portions having the Schottky contacts may be formed later in the process. In another embodiment, no openings in the conductive layer 902 may be formed for the low-side transistor structures.

The conductive layer 902 includes a conductive material or may be made conductive, for example, by doping. More particularly, the conductive layer 902 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 902 can have a thickness in a range of approximately 0.05 micron to approximately 0.5 micron. In a particular embodiment, the conductive layer 902 will be used to form a conductive electrode.

Figure 13:
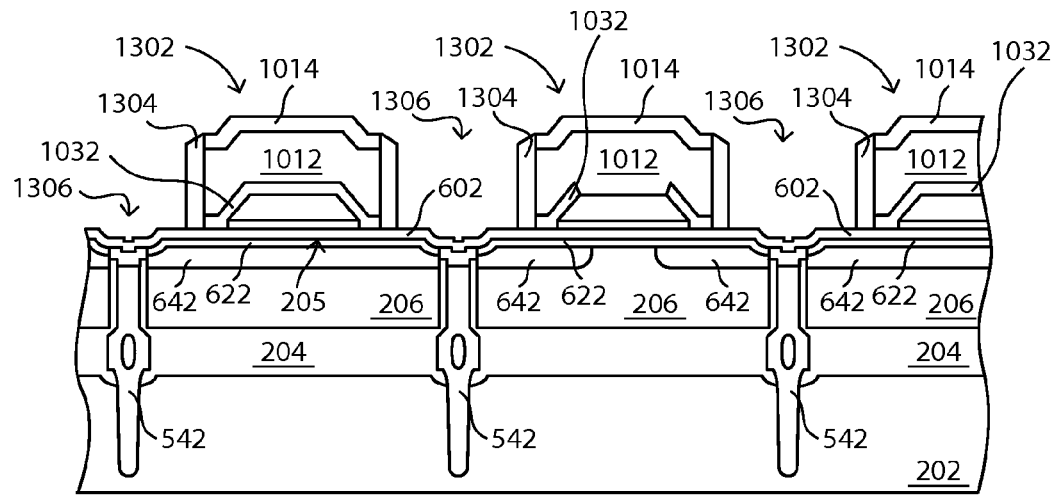
FIG. 13 includes an illustration of a cross-sectional view of the workpiece of FIG. 12 after forming insulating members and forming conductive electrodes from the patterned conductive layer.

FIG. 13 includes insulating members 1302 and insulating spacers 1304 formed over portions of the horizontally-oriented lightly doped regions 622 for the high-side and low-side transistor structures. Gate electrodes will be subsequently formed within the openings 1306 for the transistor structures for the high-side and low-side transistor structures. Substantially all of the regions with the Schottky contacts (not illustrated in FIG. 13) are covered with the insulating members 1302. The insulating members 1302 can be formed by forming one or more patterned insulating layers. In the embodiment as illustrated in FIG. 13, an insulating layer 1012 and an insulating layer 1014 are deposited over the conductive layer 902. The insulating layers 1012 and 1014 can include an oxide, a nitride, or any oxynitride, and in a particular embodiment, have different compositions as compared to each other. For example, the insulating layer 1012 can include an oxide, and the insulating layer 1014 can include a nitride. The insulating layer 1012 has a thickness in a range of approximately 0.2 micron to approximately 2.0 microns, and the insulating layer 1014 has a thickness in a range of approximately 20 nm to approximately 900 nm.

Figure 9:
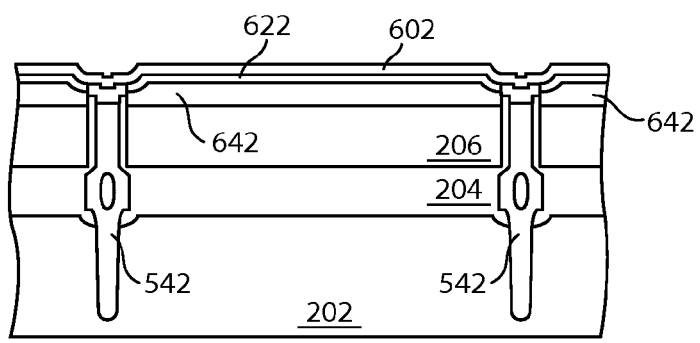

A masking layer (not illustrated) is formed over the insulating layer 1014 and patterned to form masking features that are disposed over the insulating layer 1014 at locations where the insulating members 1302 are formed. No openings are formed in the masking layer in the portions of the workpiece as illustrated in FIGS. 8 to 10, thus, the insulating layers 1012 and 1014 are unpatterned in such portions. For the high-side and low-side transistor structures, portions of the conductive layer 902 and insulating layers 1012 and 1014 are patterned, and the masking features are removed. The patterning of the conductive layer 902 forms separate conductive electrodes 1032 for the high-side transistor structures and the low-side transistor structures. The conductive electrodes 1032 for the high-side transistor structures will be electrically connected to subsequently-formed source regions for the high-side transistor structures, and the conductive electrodes 1032 for the low-side transistor structures (not illustrated in FIG. 13) will be electrically connected to subsequently-formed source regions for the low-side transistor structures.

Insulating spacers 1304 are formed along the sidewalls of the conductive electrodes 1032 and the insulating layers 1012 and 1014. In a particular embodiment, the insulating spacers 1304 include a nitride and are formed by depositing a nitride layer to a thickness in a range of approximately 20 to 90 nm and anisotropically etching the nitride layer to form the insulating spacers 1304. Openings 1306 are disposed over portions of the semiconductor layer 206 where source and channel regions will be formed.

Figure 14:
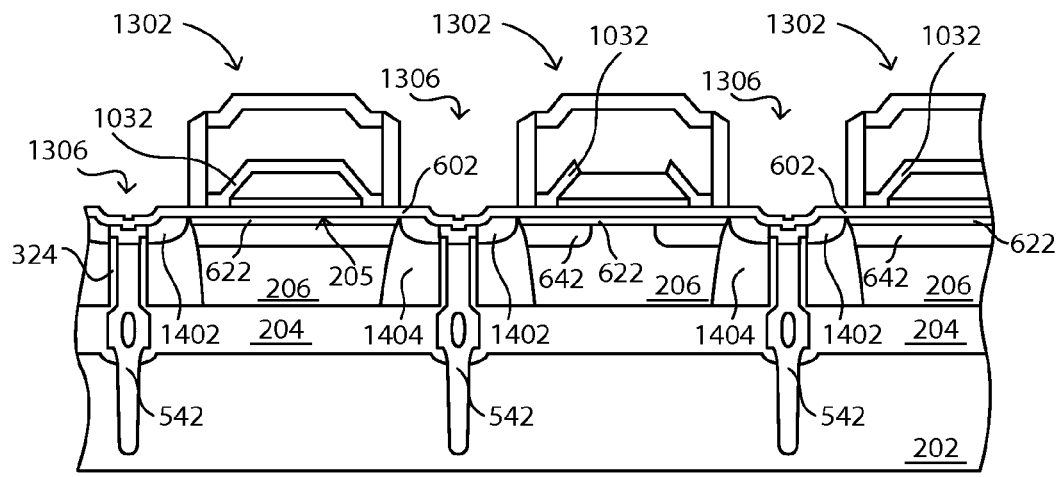
FIG. 14 includes an illustration of a cross-sectional view of the workpiece of FIG. 13 after forming channel regions and deep body doped regions.

FIG. 14 includes an illustration after forming channel regions 1402 and deep body doped regions 1404 that are formed under the openings 1306. The channel regions 1402 are formed adjacent to the primary surface 205 of the semiconductor layer 206, and the deep body doped regions 1404 are spaced away from the primary surface 205. The channel regions 1402 can be formed by ion implantation with a dose in a range of approximately $5 \times 10^{12}$ ions/cm$^2$ to approximately $5 \times 10^{13}$ ions/cm$^2$. The energy can be selected to achieve a projected range of approximately 0.05 micron to approximately 0.3 micron.

The deep body doped regions 1404 can be formed using a single implant or a combination of implants. The deep body doped regions 1404 may or may not contact the buried insulating layer 204. For a single implant or for the implant (of a combination of implants) having the lowest projected range, the dose can be in a range of approximately $5 \times 10^{13}$ ions/cm$^2$ to approximately $5 \times 10^{14}$ ions/cm$^2$.

The deep body doped regions 1404 may be formed before or after the channel regions 1402. In a particular embodiment, the deep body doped regions 1404 are formed. Portions of the implant screen layer 602 exposed within the openings 1306 are removed, and another implant screen layer (not illustrated) can be formed before forming the channel regions 1402. The other implant screen layer can be an oxide or a nitride. The other implant screen layer may be thinner than the implant screen layer 602. In a particular embodiment, the other implant screen layer is thermally grown to a thickness in a range of approximately 11 nm to approximately 50 nm. The ions for the channel regions 1402 may be implanted through the other screen implant layer.

Figure 15:
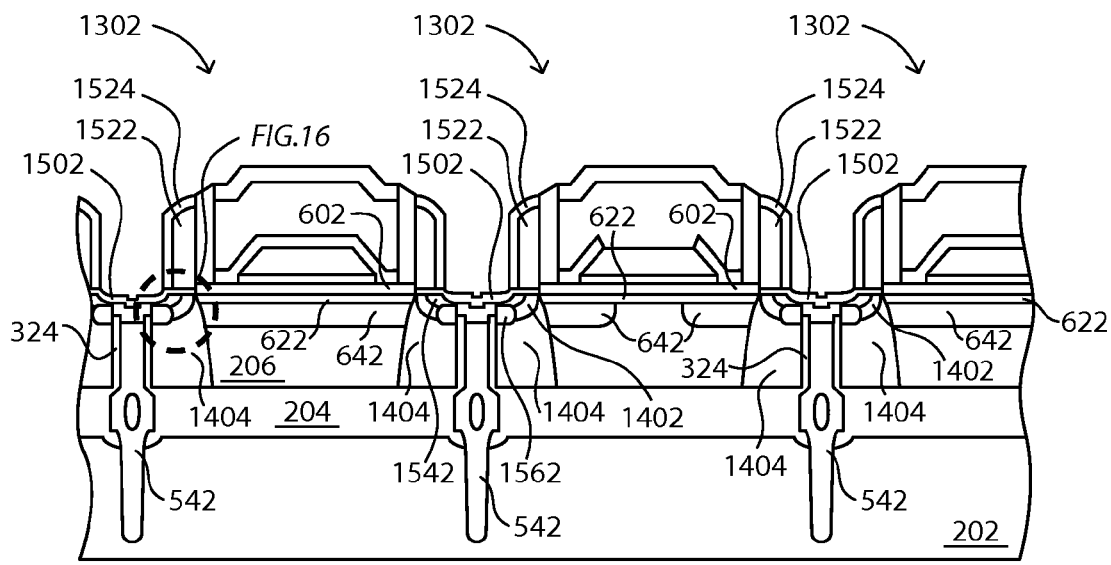
FIG. 15 includes an illustration of a cross-sectional view of the workpiece of FIG. 14 after forming gate electrodes, source extension regions, and body regions.
Figure 16:
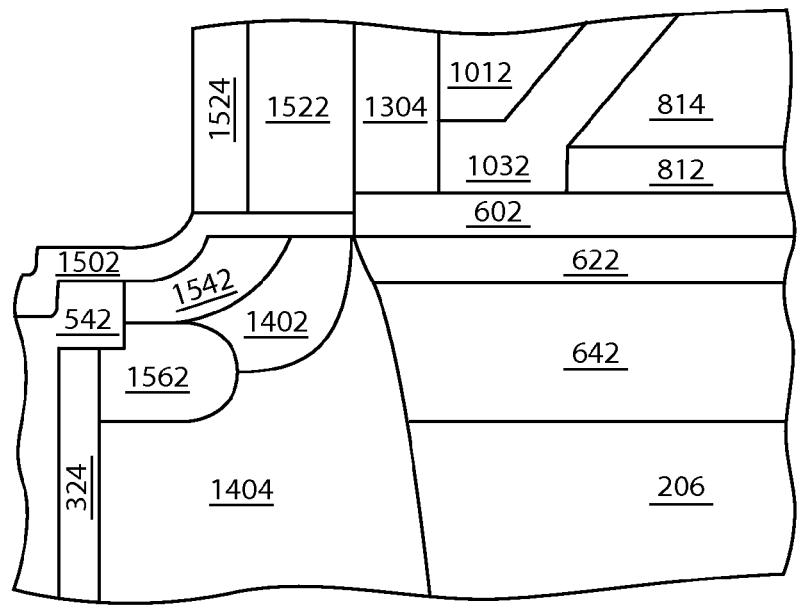
FIG. 16 includes an illustration of an enlarged view of the workpiece at the location as noted in FIG. 15.

FIG. 15 includes an illustration of the workpiece after forming a gate dielectric layer 1502, gate electrodes 1522, an insulating layer 1524 along exposed surfaces of the gate electrodes 1522, source extension regions 1542, and body regions 1562. FIG. 16 includes an enlarged view of a portion of FIG. 15 to illustrate better positional relationships between some of the features of the workpiece in FIG. 15.

Exposed portions of the implant screen layer 602 and other implant screen layer(s), if present, are removed by etching, and the gate dielectric layer 1502 is formed over the exposed surface along the bottoms of the openings 1306. In a particular embodiment, the gate dielectric layer 1502 includes an oxide, a nitride, an oxynitride, or any combination thereof and has a thickness in a range of approximately 5 nm to approximately 50 nm. The gate electrodes 1522 are disposed over the gate dielectric layer 1502. The gate electrodes 1522 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 1522. In the illustrated embodiment, the gate electrodes 1522 are formed without using a mask and have shapes of sidewall spacers.

The insulating layer 1524 can be thermally grown from the gate electrodes 1522 or may be deposited over the workpiece. The thickness of the insulating layer 1524 can be in a range of approximately 10 nm to approximately 30 nm. The source extension regions 1542 can have a dopant concentration higher than approximately $5 \times 10^{17}$ atoms/cm$^3$ and less than approximately $1 \times 10^{19}$ atoms/cm$^3$. The body regions 1562 can allow the channel regions 1402 and deep body doped regions 1404 to be electrically joined. The body regions 1562 have the same conductivity type as the channel regions 1402 and the deep body doped regions 1404 and have a peak dopant concentration of at least approximately $1 \times 10^{18}$ atoms/cm$^3$.

Figure 17:
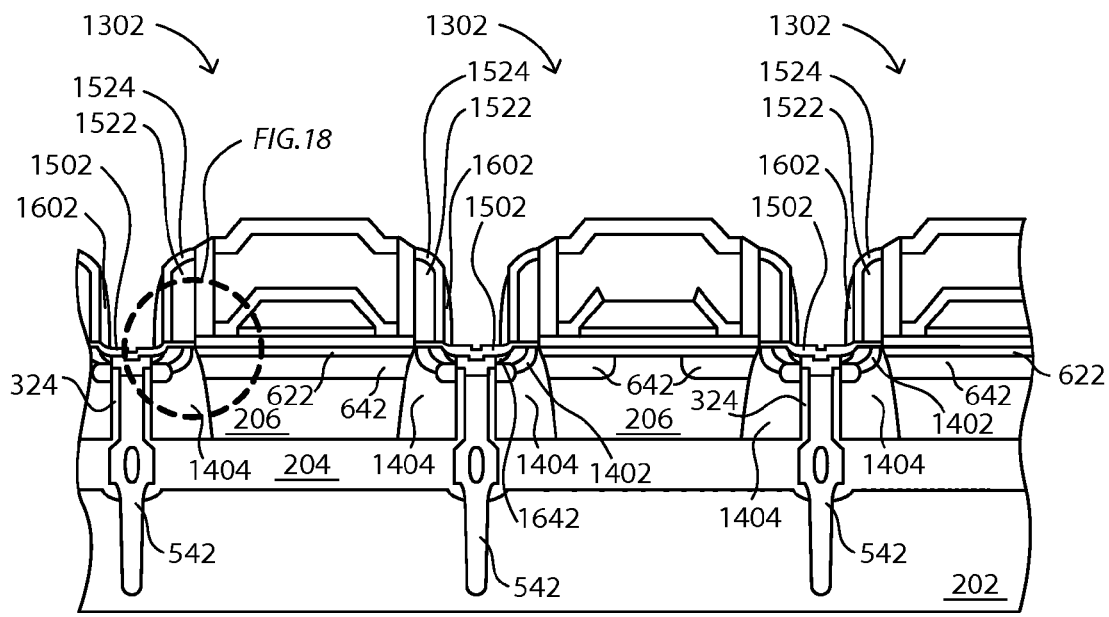
FIG. 17 includes an illustration of a cross-sectional view of the workpiece of FIG. 15 after forming insulating spacers and heavily doped source regions.
Figure 18:
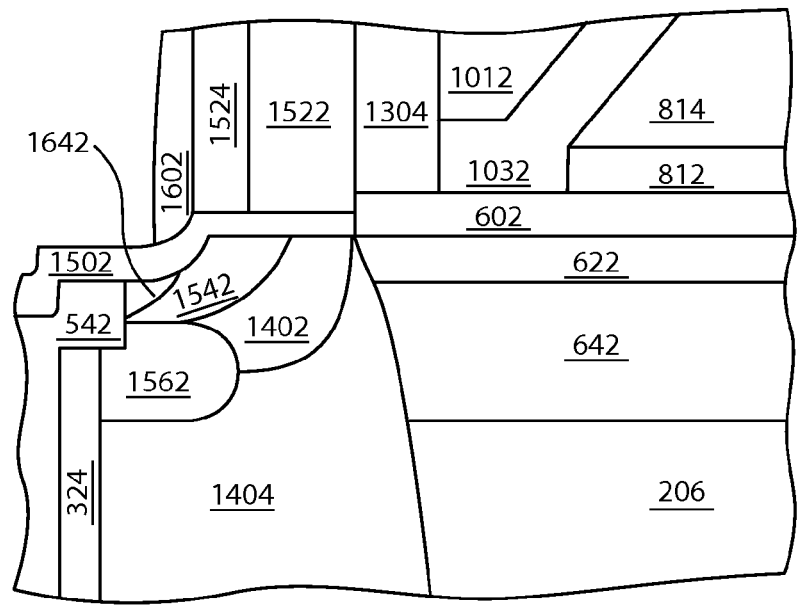
FIG. 18 includes an illustration of an enlarged view of the workpiece at the location as noted in FIG. 17.

FIG. 17 includes an illustration after forming insulating spacers 1602 and heavily doped source regions 1642. FIG. 18 includes an enlarged view of a portion of FIG. 17 to illustrate better positional relationships between the features of the workpiece. The insulating spacers 1602 are formed to cover portions of the source extension regions 1542. The insulating spacers 1602 can be formed by depositing an insulating layer and anisotropically etching the insulating layer. The insulating spacers 1602 can include an oxide, a nitride, an oxynitride, or any combination thereof, and have widths at the bases of the insulating spacers 1602 in a range of approximately 50 nm to approximately 200 nm. The heavily doped source regions 1642 allow ohmic contacts to be subsequently made and have a dopant concentration of at least approximately $1 \times 10^{19}$ atoms/cm$^3$. The heavily doped source regions 1642 can be formed using ion implantation. The heavily doped source regions 1642 have an opposite conductivity type as compared to the channel regions 1402 and the same conductivity type as the horizontally-oriented lightly doped regions 622 and the buried conductive region 202.

Referring briefly to FIGS. 8 to 10, the process sequence from the formation of the insulating spacers 1304 through the formation of heavily doped source regions 1642 does not significantly affect the semiconductor layer 206 and doped regions in FIGS. 8 to 10. Subsequent process can affect the portions of the workpiece in FIGS. 8 to 10 where Schottky contacts will be formed.

Figure 19:
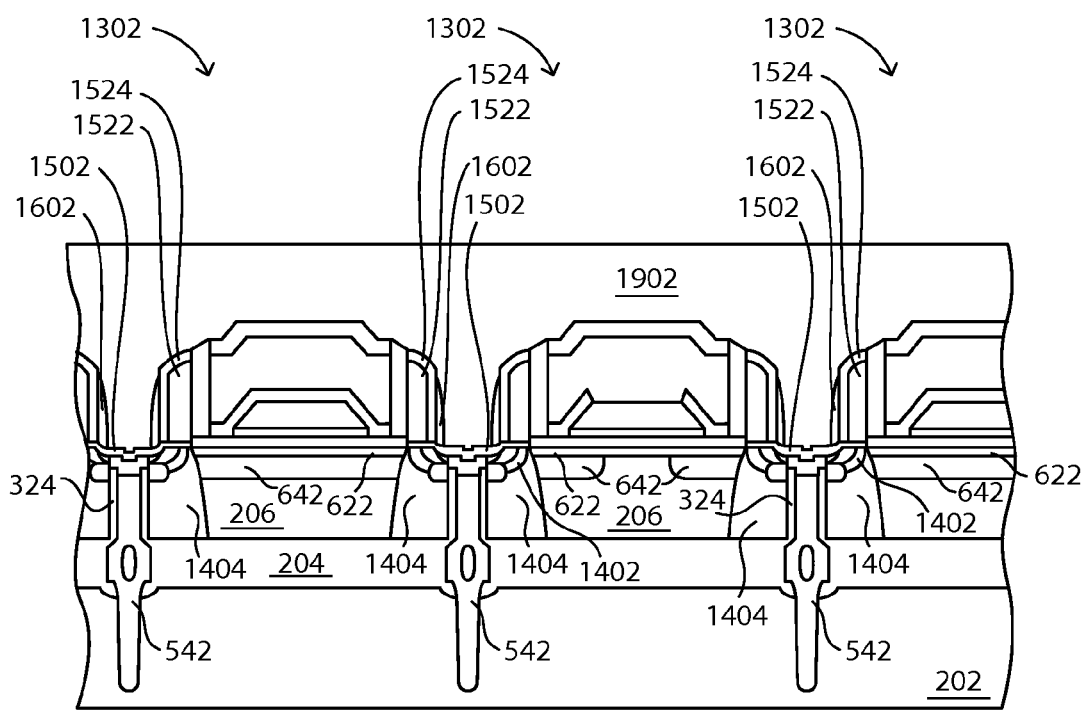
FIG. 19 includes an illustration of a cross-sectional view of the workpiece of FIG. 17 after forming an interlevel dielectric layer.

FIG. 19 includes an illustration of the workpiece after forming an interlevel dielectric (ILD) layer 1902 over substantially all of the workpiece. The ILD layer 1902 can include an oxide, a nitride, an oxynitride, or any combination thereof. The ILD layer 1902 can include a single film having a substantially constant or changing composition (e.g., a high phosphorus content further from the semiconductor layer 206) or a plurality of discrete films. An etch-stop film, an antireflective film, or any combination thereof may be used within or over the ILD layer 1902 to help with processing. The ILD layer 1902 may be planarized to improve process margin during subsequent processing operations (for example, lithography, subsequent polishing, or the like).

Figure 20:
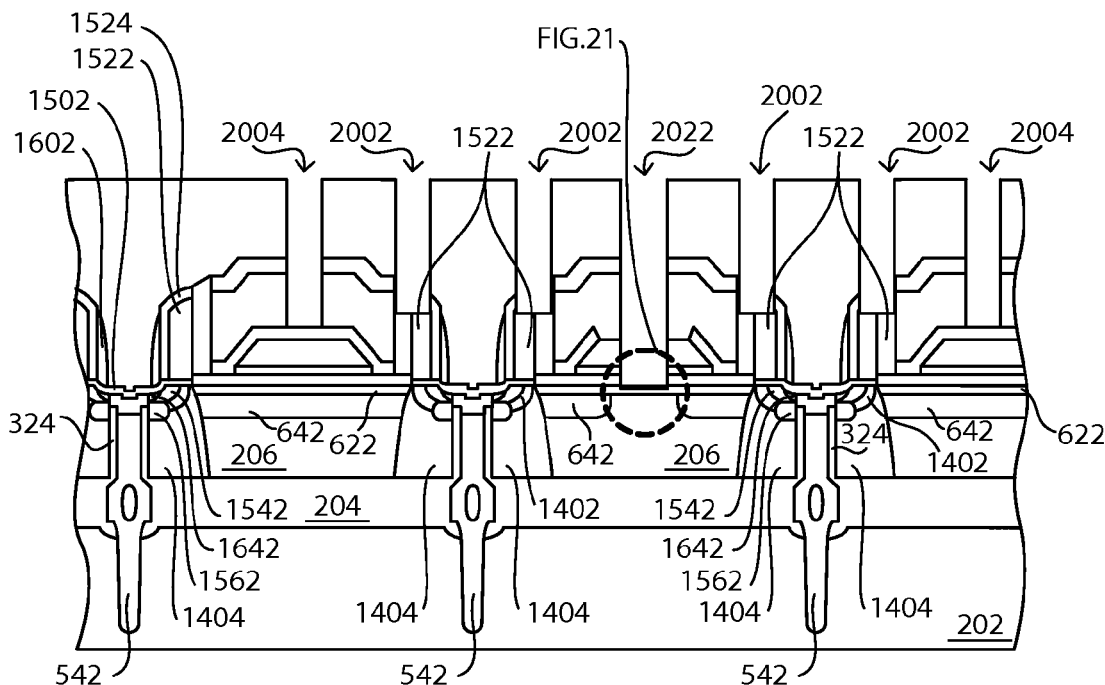
FIG. 20 includes an illustration of a cross-sectional view of the workpiece of FIG. 19 after forming contact openings for the gate electrodes and the conductive electrodes for the high-side and low-side transistor structures, and doping portions of the horizontally-oriented lightly doped regions for ohmic contacts to the drain regions of the high-side transistor.
Figure 21:
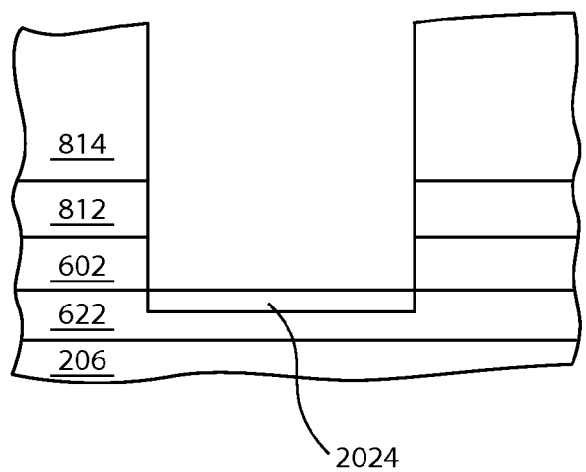
FIG. 21 includes an illustration of an enlarged view of the workpiece in FIG. 20.
Figure 22:
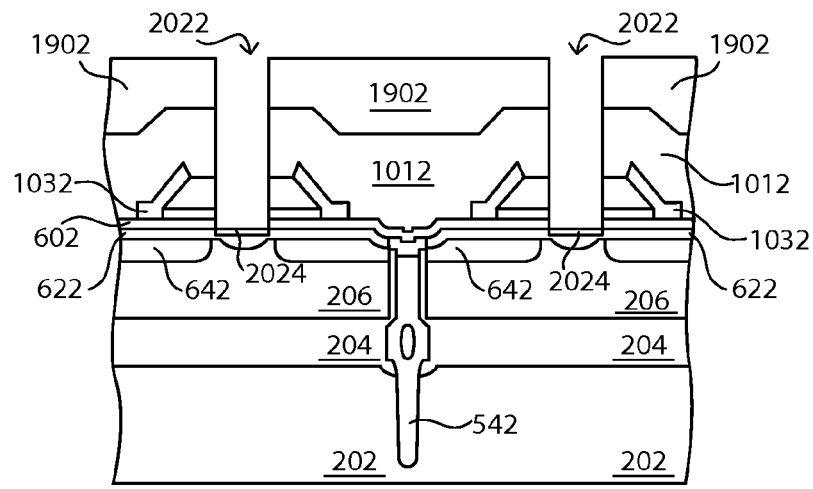
FIGS. 22, 23, and 24 include illustrations of cross-sectional views of the workpiece of FIG. 19 after forming contact openings and doping portions of the horizontally-oriented lightly doped regions for portions of the workpiece adjacent to where Schottky contacts will be formed.
Figure 23:
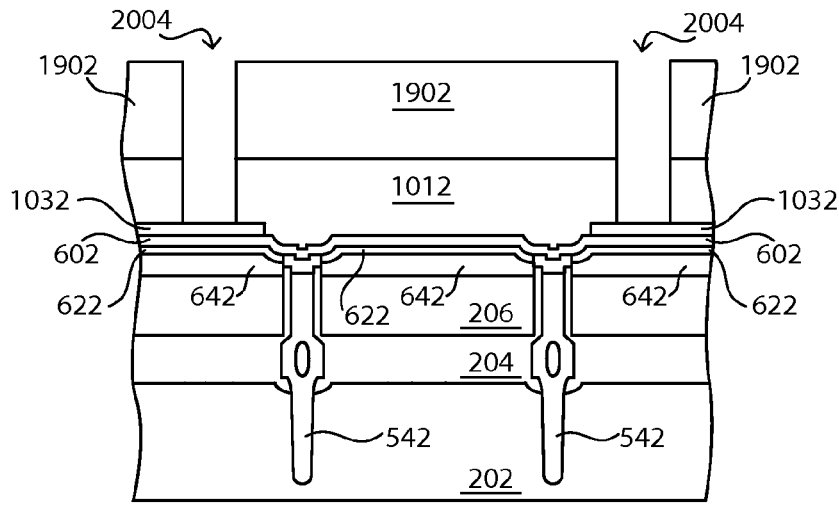
Figure 24:
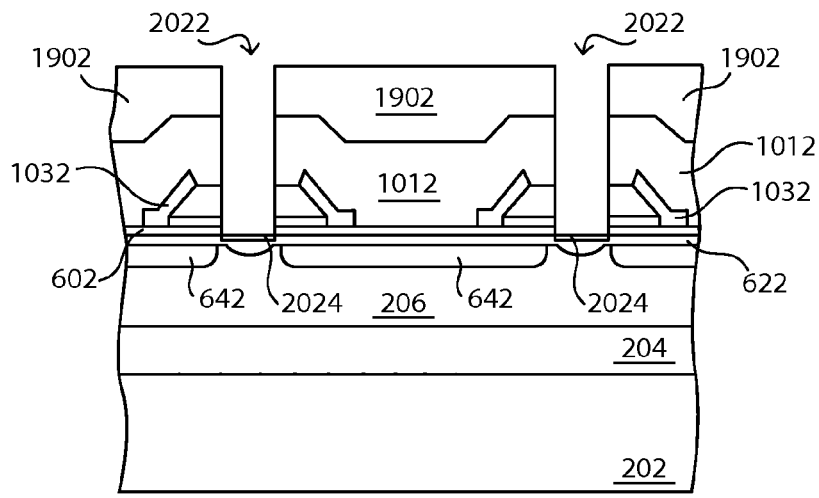

FIGS. 20 to 24 include an illustration after forming contact openings 2002, 2004, and 2022, and heavily doped regions 2024. FIG. 20 corresponds to the high-side transistor, and FIGS. 22 to 24 correspond to regions where Schottky contacts will be formed. FIG. 21 includes an enlarged view of a portion of FIG. 20 to illustrate better positional relationships between some of the features of the workpiece in FIG. 20.

The contact openings 2002 extend to the gate electrodes 1522 of the high-side and low-side transistor structures. The contact openings 2004 extend to conductive electrodes 1032. The contact openings 2022 extend to portions of the horizontally-oriented lightly doped regions 622. The bottoms of the contact openings 2022 can be doped to form heavily doped regions 2024, which allow ohmic contacts to be formed to the horizontally-oriented lightly doped regions 622. The heavily doped regions 2024 have the same conductivity type as the horizontally-doped regions 622 and a dopant concentration of at least $1 \times 10^{19}$ atoms/cm$^3$. The order of formation of the contact openings is not critical. The contact openings 2002 can be formed separately from the contact openings 2004, which can be formed separately from the contact openings 2022. In another embodiment, the contact openings 2002 and 2004 may be formed at substantially the same time.

Figure 25:
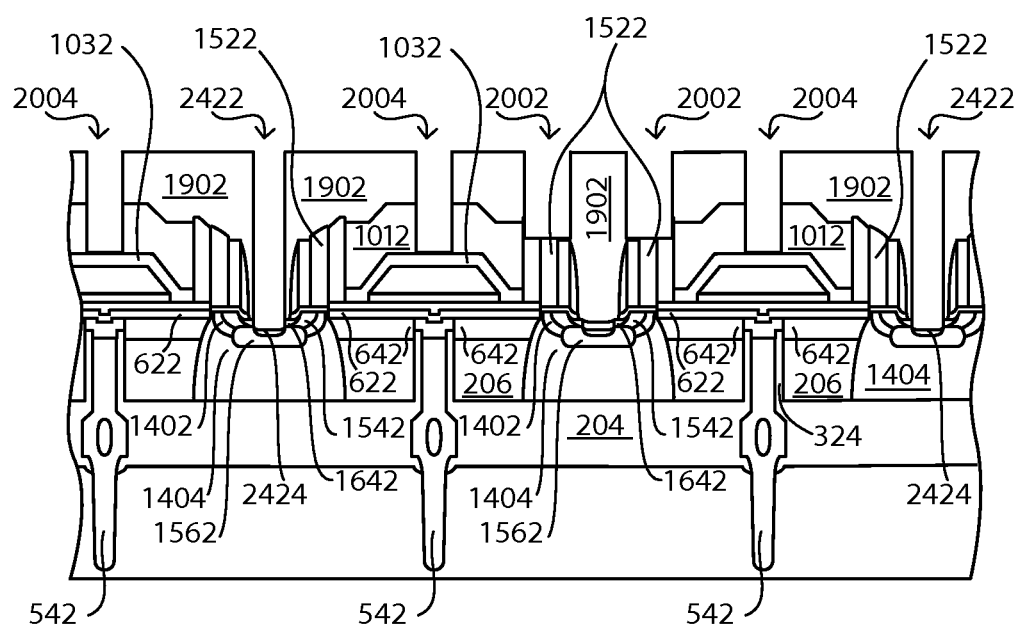
FIG. 25 includes an illustration of a cross-sectional view of the workpiece of FIG. 19 after forming contact openings, etching through the heavily doped source regions, and doping portions of the body regions to form body contact regions for the low-side transistor.
Figure 26:
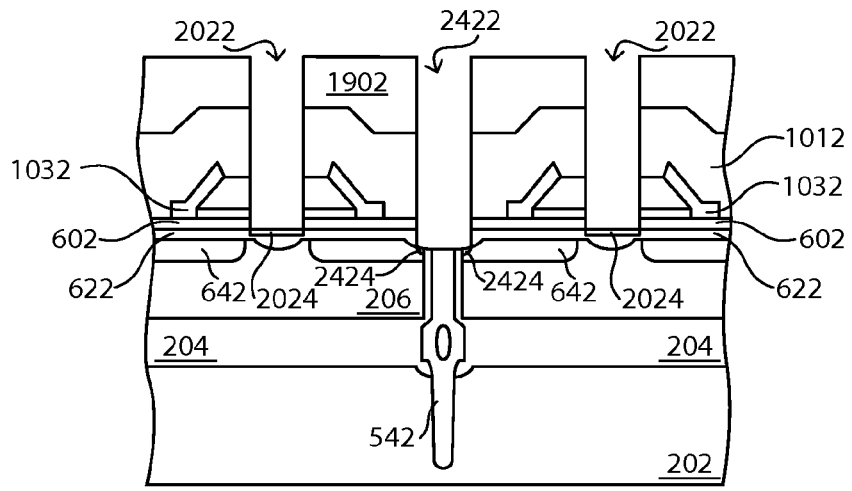
FIGS. 26, 27, and 28 include illustrations of cross-sectional views of the workpiece of FIGS. 22 to 24, respectively, after forming contact openings, etching through the horizontally-oriented lightly doped regions, and doping portions of the resurf regions to form resurf contact regions adjacent to where Schottky contacts will be formed.
Figure 27:
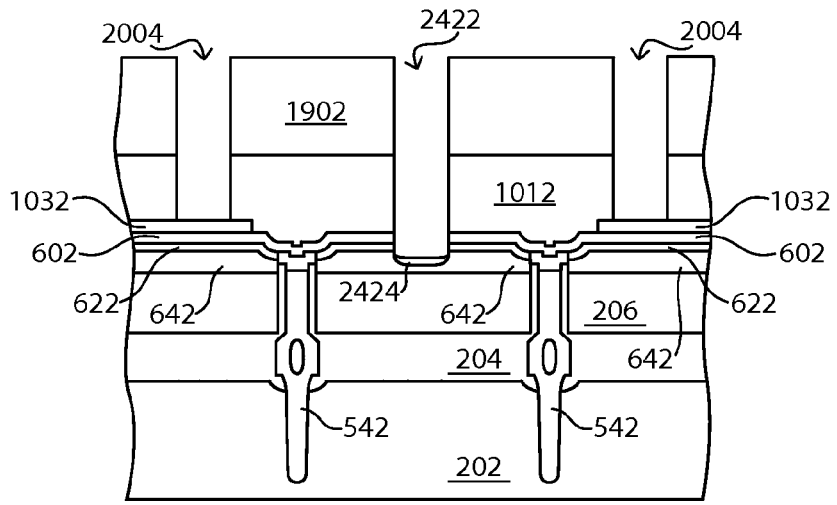
Figure 28:
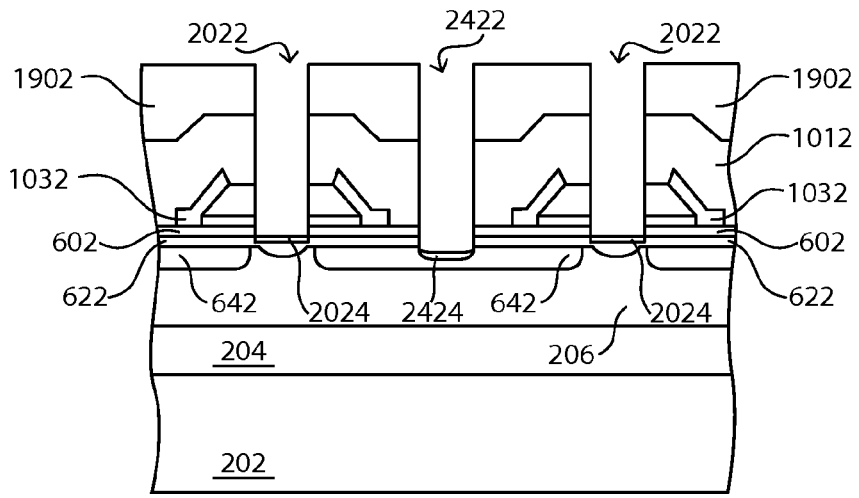

FIGS. 25 to 28 include an illustration after contact openings 2422, and heavily doped regions 2424 have been formed. FIG. 25 corresponds to the low-side transistor structures, and FIGS. 26 to 28 correspond to regions where Schottky contacts will be formed. The contact openings 2422 extend through the ILD layer 1902, source regions 1642, and the horizontally-oriented lightly doped regions 622 to portions of the body regions 1562 for the low-side transistor and resurf regions 642 for the Schottky contacts. The bottoms of the contact openings 2422 can be doped to form heavily doped regions 2424, which allow ohmic contacts to be formed to the body regions 1562 and the resurf regions 642. The heavily doped regions 2424 have the same conductivity type as the resurf regions 642 and body regions 1562 and a dopant concentration of at least $1 \times 10^{19}$ atoms/cm$^3$. The contact openings 2422 can be formed before or after the contact openings 2002, 2004, and 2022. After forming the contact openings 2422, a sacrificial insulating layer (not illustrated) may be formed along exposed portions of source regions 1642 and horizontally-oriented regions 622 to reduce the likelihood of counterdoping of such regions when forming the heavily doped regions 2424. If needed or desired, the sacrificial insulating layer may be anisotropically etched along the bottom of the contact openings 2422. The heavily doped regions 2424 may be formed by ion implantation or another suitable doping technique. The workpiece may be annealed to activate the dopants introduced into the workpiece during the contact opening process sequence. After doping and anneal, the sacrificial insulating layer is removed to expose portions of the source regions 1642 and horizontally-oriented regions 622.

Figure 29:
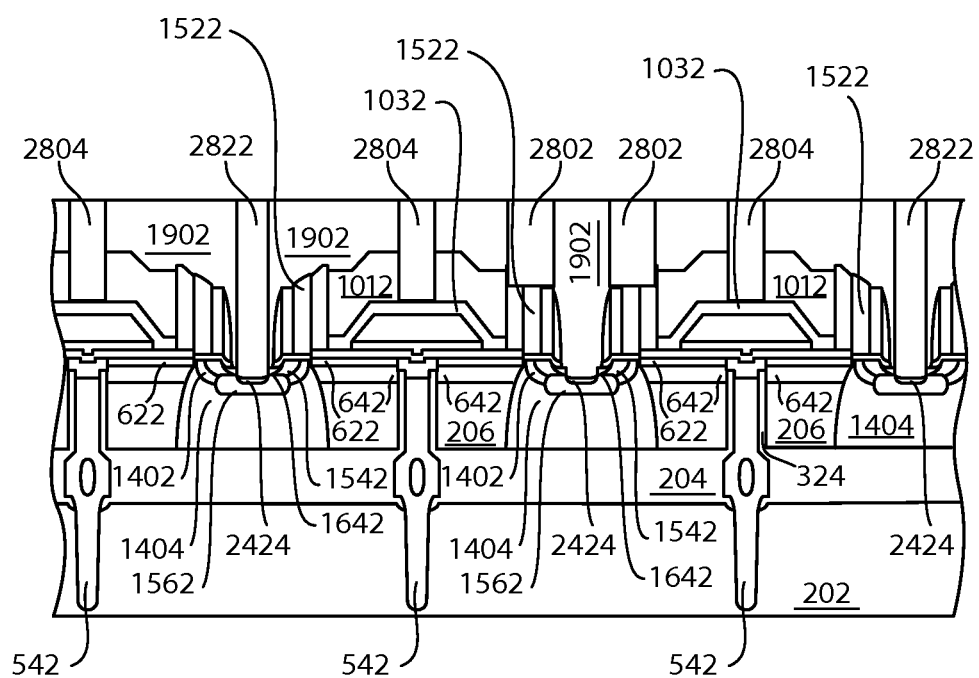
FIG. 29 includes an illustration of a cross-sectional view of the workpiece of FIG. 25 after forming conductive plugs for the low-side transistor.
Figure 30:
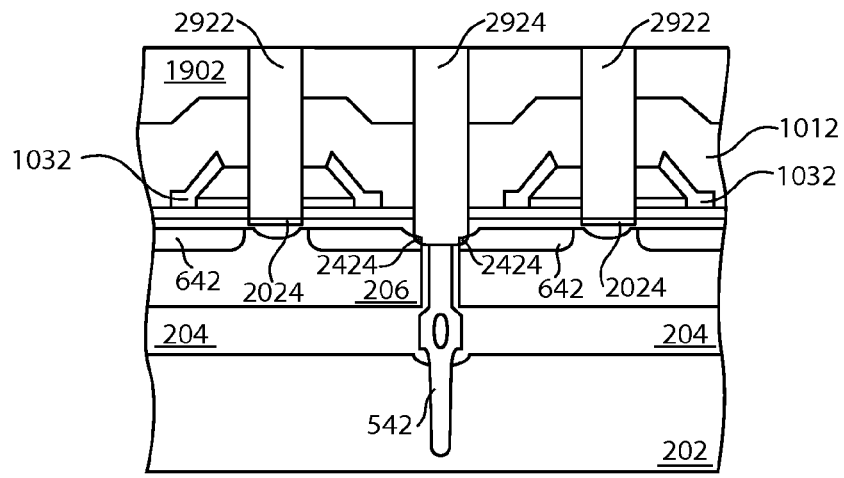
FIGS. 30, 31, and 32 include illustrations of cross-sectional views of the workpiece of FIGS. 26 to 28, respectively, after forming conductive plugs for Schottky contacts with the horizontally-oriented lightly doped regions, and conductive plugs for ohmic contacts to the resurf regions.

FIGS. 29 to 33 include illustrations after forming conductive plugs 2802, 2804, 2822, 2922, and 2924. FIG. 29 corresponds to the low-side transistor, FIGS. 30 to 32 correspond to regions where Schottky contacts are formed, and FIG. 33 includes an enlarged view of a portion of FIG. 31 near the conductive plug 2924. The conductive plugs 2802 are electrically connected to the gate electrodes 1522 of the high-side and low-side transistor structures, the conductive plugs 2804 are electrically connected to the conductive electrodes 1032, the conductive plugs 2822 are electrically connected to source regions of the low-side transistor, the conductive plugs 2922 are electrically connected to some of the horizontally-oriented lightly doped regions 622, and the conductive plugs 2924 are electrically connected to some of the heavily doped regions 2424 and form Schottky contacts as illustrated in FIGS. 30 to 33 where the conductive plugs 2924 contact the horizontally-oriented lightly doped regions 622. Although not illustrated in FIGS. 29 to 33, other conductive plugs 2922 are electrically connected to the horizontally-oriented lightly doped regions 622 for the high-side transistor. In an embodiment, none of the conductive plugs within the ILD layer 1902 is electrically connected to the horizontally-oriented lightly doped regions 622 for the low-side transistor structures.

Figure 31:
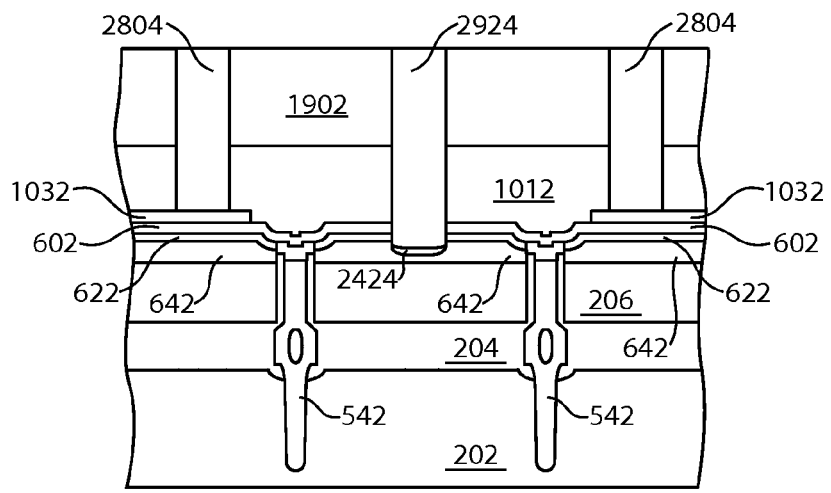
Figure 32:
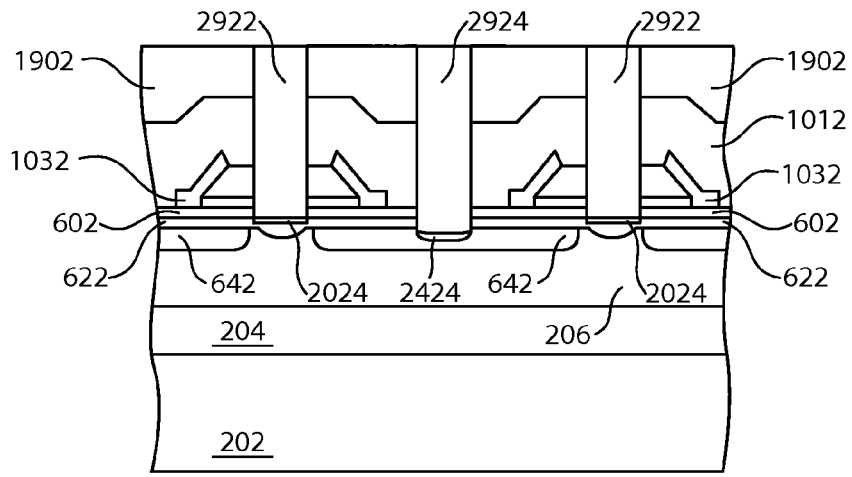
Figure 33:
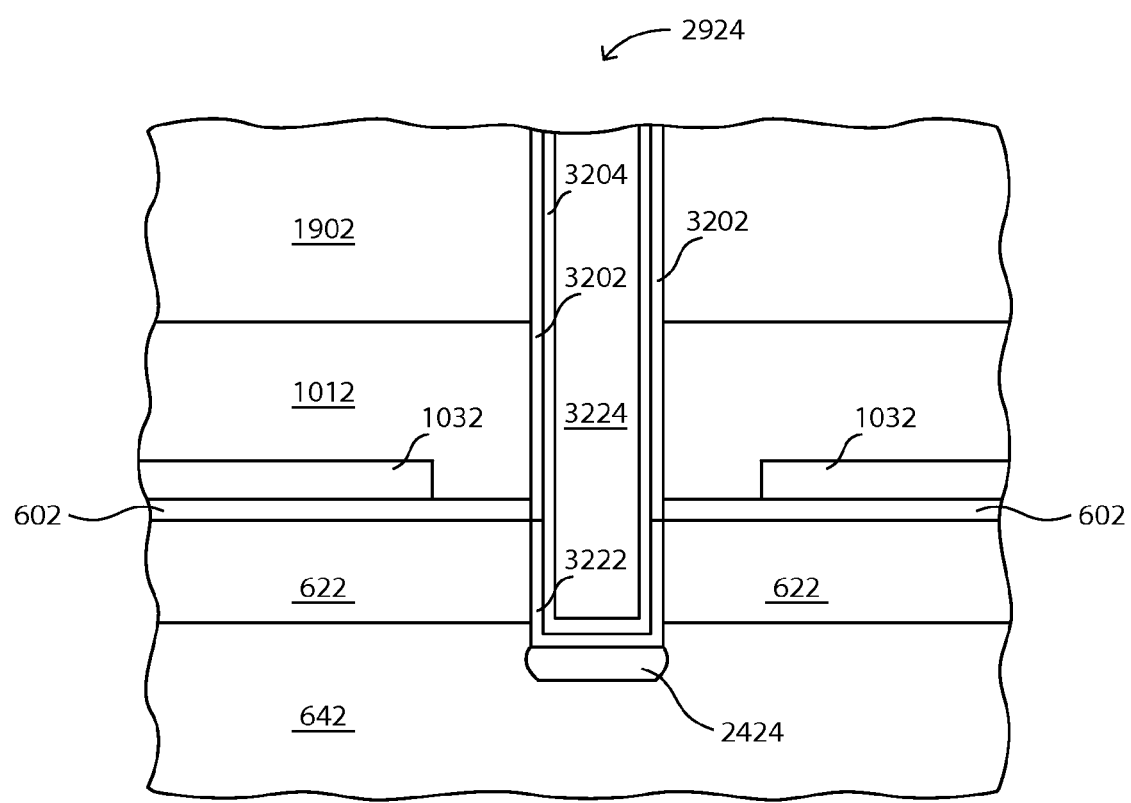
FIG. 33 includes an illustration of an enlarged view of the workpiece of FIG. 31 illustrating details regarding the conductive plug.

Formation of the conductive plugs is described with respect to the conductive plug 2924 as illustrated in FIG. 33, which is an enlarged view of a portion of FIG. 31. In an embodiment, a layer 3202 including a refractory metal, such as Ti, Ta, W, Co, Pt, or the like, can be deposited over the workpiece and within the contact openings 2002, 2004, 2022 and 2422. If needed or desired, a layer 3204 including a metal nitride layer can be deposited over the layer 3202. The workpiece can be annealed so that portions of the layer 3202 are selectively reacted with exposed silicon, such as substantially monocrystalline or polycrystalline silicon, to form a metal silicide 3222. Thus, portions of the gate electrodes 1522, conductive electrodes 1032, heavily doped source regions 1642, horizontally-oriented lightly doped regions 622, and heavily doped regions 2424 can react with the metal within the layer 3202 to form a metal silicide 3222. Portions of the layer 3202 that contact insulating layers do not react. A layer 3224 of a conductive material fills the remainder of the contact openings 2002, 2004, 2022 and 2422. The layer 3224 may include any of the materials as previously described with respect to the conductive layer used to fill the trenches 322. Portions of the layers 3202, 3204, and 3224 that overlie the ILD layer 1902 are removed to form the conductive plugs 2802, 2804, 2833, 2922, and 2924.

Referring to FIG. 33, a Schottky contact is formed where the metal silicide 3222 contacts the horizontally-oriented lightly doped region 622. Similarly, the structures in FIGS. 30 and 32 also include Schottky contacts where the conductive plugs 2924 contact the horizontally-oriented lightly doped regions 622. The conductive plug 2924 forms an ohmic contact with the heavily doped region 2424, which is disposed within the resurf region 642, and therefore, the resurf region 642 is electrically connected to the conductive plug 2924. The conductive plug 2924 is spaced apart from the conductive electrode 1032. Referring to FIG. 33, the conductive plug 2924 can be electrically connected to the conductive electrode 1032 at a location not illustrated in FIG. 33.

Figure 34:
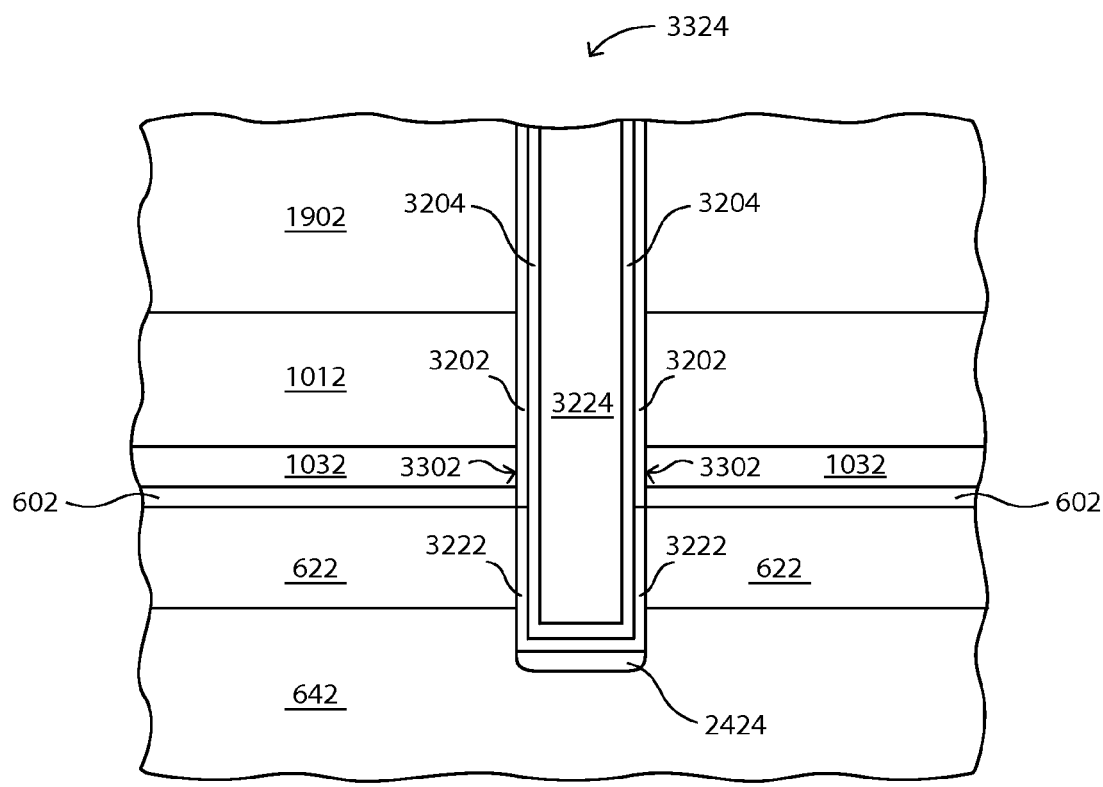
FIG. 34 includes an illustration of a workpiece of an alternative embodiment to the embodiment as illustrated in FIG. 33.

In another embodiment as illustrated in FIG. 34, a conductive plug 3324 can contact the conductive electrode 1032, such that the conductive electrode 1032 is electrically connected to the resurf region 642 via the conductive plug 3324. Referring to FIG. 12, after forming the conductive layer 902, the conductive layer 902 can be patterned to form the conductive electrode 1032, such that the conductive electrode 1032 will be spaced apart from locations where contacts to the drain regions of the high-side transistor structures will be formed. However, the conductive layer 902 is not patterned over areas where source regions and Schottky contacts are formed, and thus the conductive electrode 1032 overlies such regions until the contact openings 2422 are formed. Portions of the conductive electrode 1032 are etched when forming the contact openings 2422. When the layer 3202 is deposited, it contacts the conductive electrode 1032. If the conductive electrode 1032 includes amorphous or polycrystalline silicon, a portion of the conductive electrode 1032 reacts with the layer 3202. Otherwise, the portion of the layer 3202 near the conductive electrode 1032 remains unreacted.

FIGS. 35 to 39 includes illustrations of high-side transistor structures (FIG. 35), the low-side transistor structures (FIG. 36), and Schottky contacts (FIGS. 37 to 39) after a first level of interconnects is formed. Another ILD layer 3402 is formed and can include an oxide, a nitride, an oxynitride, or any combination thereof. The ILD layer 3402 can include any of the compositions as previously described with respect to the ILD layer 1902. The ILD layer 3402 can have substantially the same composition or a different composition as compared to the ILD layer 1902. The ILD layer 3402 is patterned to define via openings.

Figure 35:
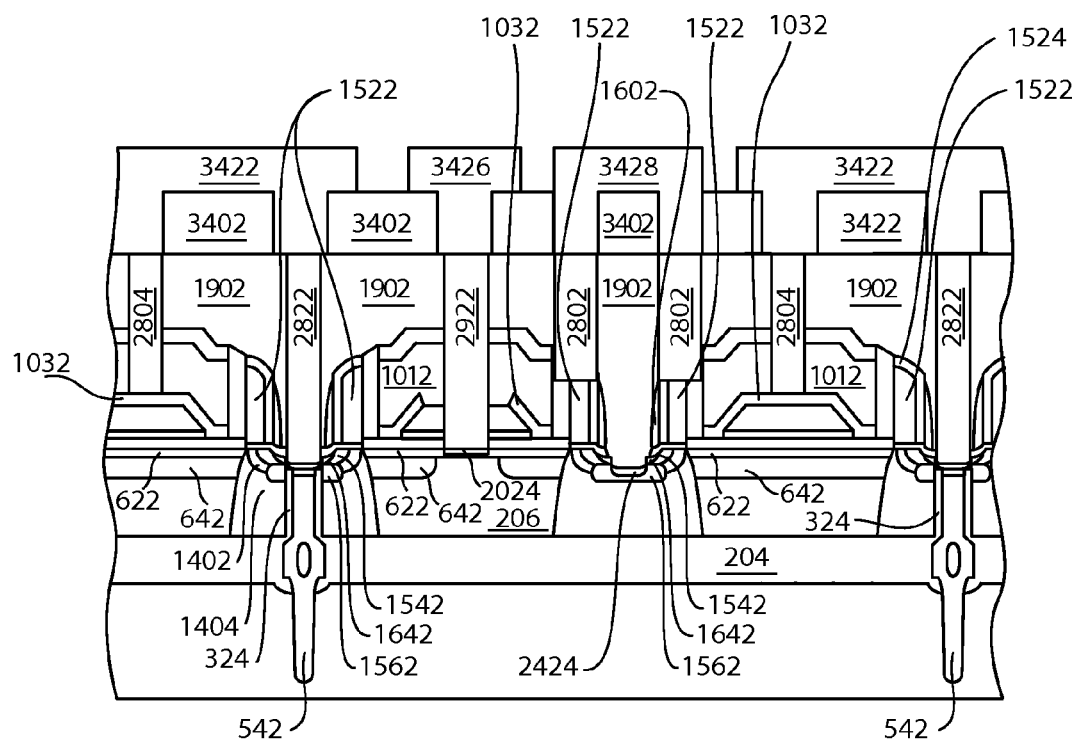
FIGS. 35, 36, 37, 38, and 39 include illustrations of cross-sectional views of the workpiece of FIGS. 20 and 29 to 32, respectively, after forming a first level of interconnects for the high-side transistor, low-side transistor, and Schottky contacts.
Figure 36:
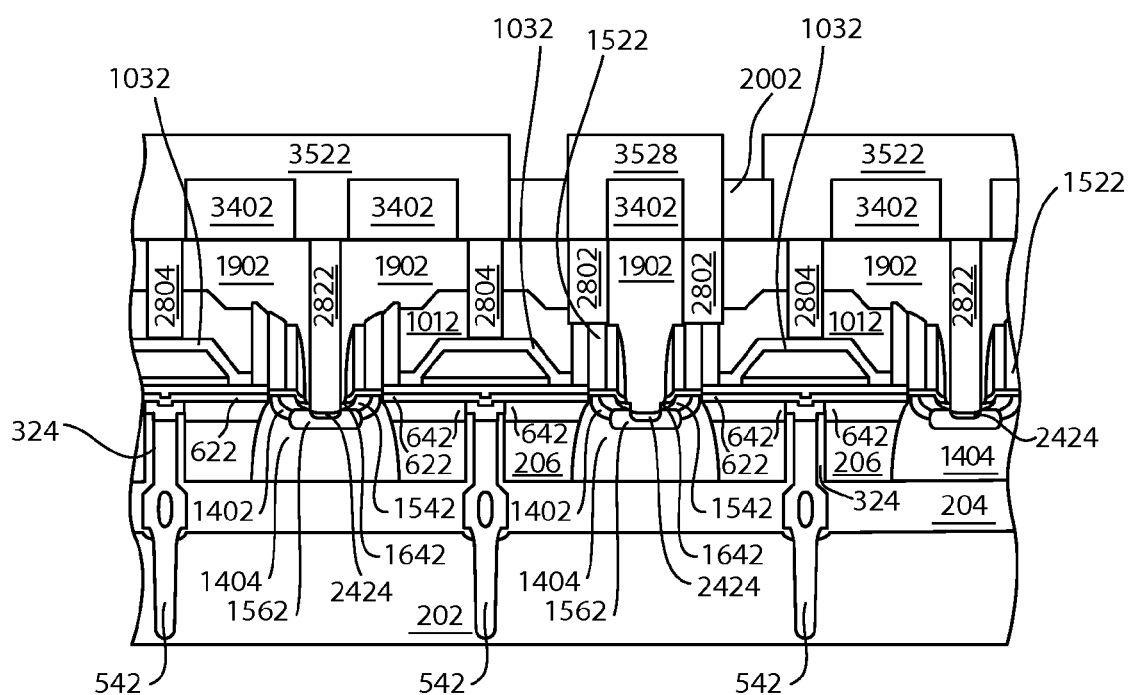
Figure 39:
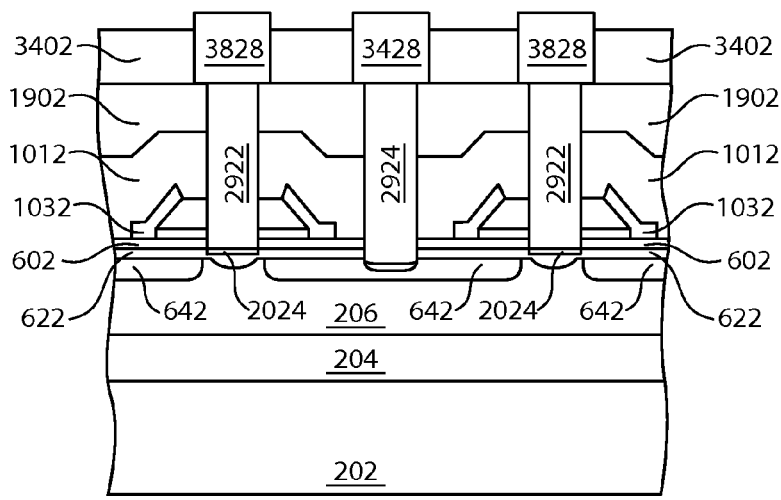

Interconnects 3422, 3426, 3428, 3522, 3528, and 3828 are formed that extend at least partly within the via openings within the ILD layer 3402. The interconnects 3422 electrically connect the conductive electrode 1032 and the heavily doped source regions 1642 within the high-side transistor structures to each other. The interconnects 3426 (one of which is illustrated in FIG. 35) electrically connect the heavily doped regions 2024 of the drain regions within the high-side transistor structures, the heavily doped regions 2024 of cathode of the Schottky diode 13, and the $V_D$ terminal (FIG. 1) to each other. The interconnects 3428 (one of which is illustrated in FIG. 35) electrically connect the gate electrodes of the high-side transistor structures and the control unit 16 (FIG. 1) to each other. The interconnects 3522 electrically connect the conductive electrode 1032, the heavily doped source regions 1642 of the low-side transistor structures, the heavily doped region 2424 of the anode of the Schottky diode 15, and the $V_S$ terminal (FIG. 1) to one another. The interconnects 3528 (one of which is illustrated in FIG. 36) electrically connect the gate electrodes of the low-side transistor structures and the control unit 16 (FIG. 1). Referring to FIG. 39, the interconnect 3428 electrically connects heavily doped region 2424 of the anode of the Schottky contact to the control voltage supply of the charge pump or other circuit 166 of the control unit 16 (FIG. 1), and the interconnect 3828 electrically connects the cathode of the Schottky contact to the control circuitry in circuit 166 for the gate electrodes of the high-side transistor structures.

Figure 37:
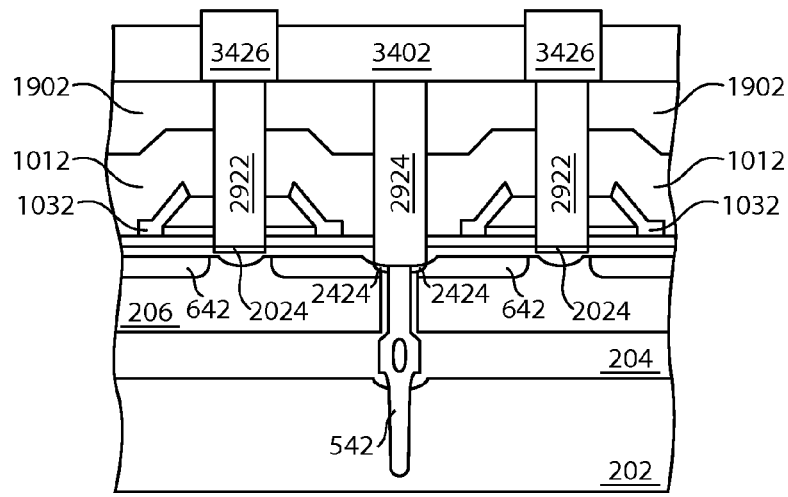
Figure 38:
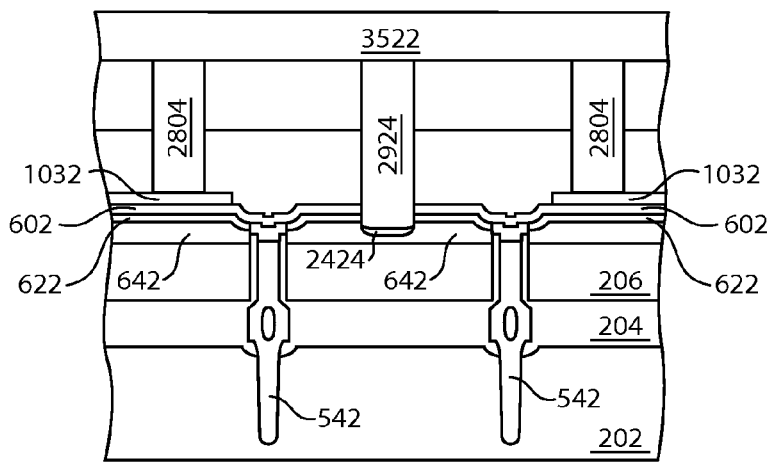

The Schottky contacts as illustrated in FIGS. 37 and 38 can be used to help reduce the amount of accumulated charge in the high-side transistor structures or the low-side transistor structures during the dead time of a switching cycle. Referring to FIG. 37, heavily doped regions 2024 are electrically connected to the interconnects 3426 that are electrically connected to the drain regions of the high-side transistor structures, and the heavily doped region 2424 is electrically connected to and source regions of the high-side transistor structures via the buried conductive region 202. The Schottky contact in FIG. 37 forms the Schottky diode 13 electrically connected in parallel with the high-side transistor 12, wherein the anode of the Schottky diode 13 is electrically connected to the source regions of the high-side transistor structures via the buried conductive region 202, and the cathode of the Schottky diode 13 is electrically connected to the drain regions of the high-side transistor structures via the interconnect 3426.

Referring to FIG. 38, the conductive electrode 1032 and the heavily doped region 2424 are electrically connected to the interconnect 3522 that is electrically connected to source regions of the low-side transistor structures. The Schottky contact in FIG. 38 forms a Schottky diode 15 electrically connected in parallel with the low-side transistor 14, wherein the anode of the Schottky diode 15 is electrically connected to the source regions of the low-side transistor structures via the interconnect 3522, and the cathode of the Schottky diode 15 is electrically connected to the drain region of the low-side transistor structures via the buried conductive region 202.

Referring to FIG. 39, the Schottky contact can help in providing a relatively higher voltage used for the gate electrode of the high-side transistor 12, as compared to the gate electrode of the low-side transistor 14. The Schottky diode formed by the Schottky contact in FIG. 39 can be part of the charge pump or other circuit 166. The anode of the Schottky diode can be coupled to a control voltage supply of the charge pump, and the cathode can be coupled to the control circuitry for the gate electrode of the high-side transistor 12.

Although not illustrated, additional or fewer layers or features may be used as needed or desired to form the electronic device. Field isolation regions are not illustrated but may be used to help electrically isolate portions of the high-side transistor structures from the low-side transistor structures when on the same die. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor and Schottky structures that are substantially identical to the structures as illustrated in FIGS. 35 to 39. The transistor structures in FIG. 35 can be connected in parallel to each other to form the high-side transistor 12, and the transistor structures in FIG. 36 can be connected in parallel to each other to form the low-side transistor 14. In a particular embodiment, each power transistor may be designed to have a maximum source-to-drain voltage difference of approximately 30 V, and a maximum source-to-gate voltage difference of approximately 20 V. During normal operation, the source-to-drain voltage difference is no greater than approximately 20 V, and the source-to-gate voltage difference is no greater than approximately 9 V. The Schottky diodes formed by the Schottky contacts in FIGS. 37 to 39 can help to protect parts of the circuit, the load, or any combination thereof during transient times after switching the circuit. The Schottky contacts can be integrated into the process flow and occupy a relatively small amount of area.

Figure 40:
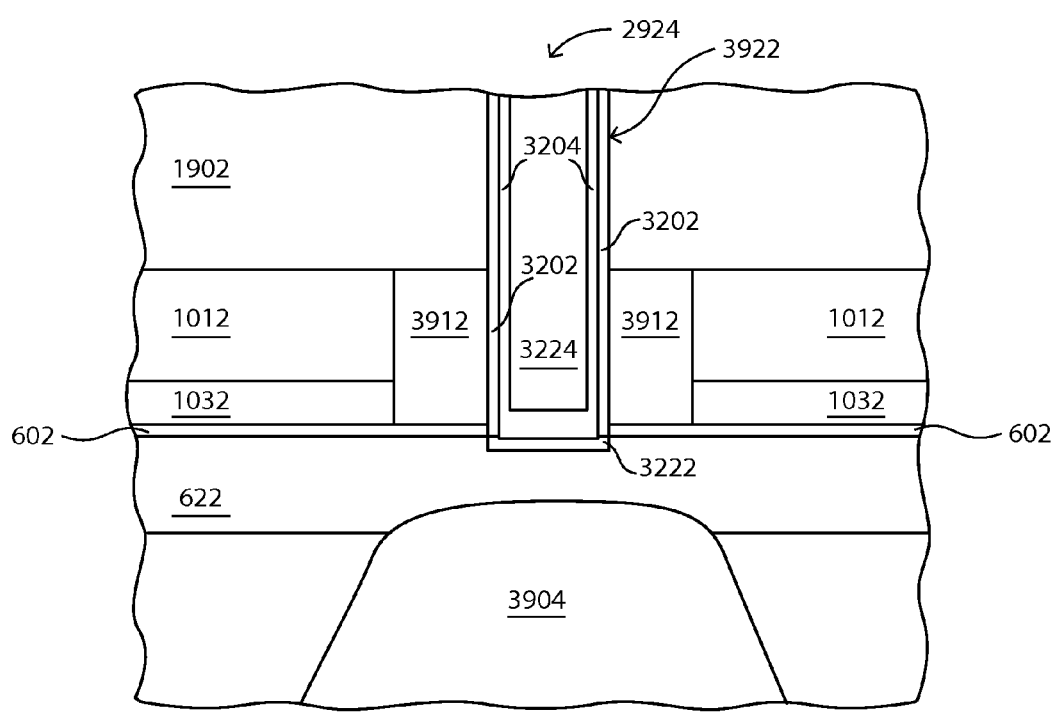
FIG. 40 includes an illustration of a workpiece of an alternative embodiment to the embodiment as illustrated in FIG. 33.

In a further embodiment, the Schottky contacts can be formed along an upper surface of the horizontally-oriented lightly doped region 622, as illustrated in FIG. 40, as opposed to a side surface of the horizontally-oriented lightly doped region 622 as illustrated in previously described embodiments. When patterning the insulating layer 1012 to form openings for the gate electrodes and doped regions within the semiconductor layer 206 for the high-side and low-side transistor structuress, the insulating layer 1012 in regions where the Schottky contacts will be formed may also be patterned. Referring to FIG. 40, the insulating layer 1012 is patterned to form an opening, and a doped region 3904 is formed and has substantially the same dopant concentration and depth as the deep body doped regions 1404. In a particular embodiment, the doped region 3904 and 1404 may be formed as substantially the same time using the same doping sequence. An insulating layer 3912 may be formed within the opening and be planarized to remove portions of the insulating layer 3912 overlying the insulating layer 1012. A masking layer (not illustrated) may be formed over the regions where the Schottky contacts are being formed, and openings in the masking layer may expose portions of the insulating layer 3912 where gate electrodes and doped regions within the semiconductor layer will be formed for the high-side and low-side transistor structures. The channel regions for the high-side and low-side transistor structures may be formed after the insulating layer 3912 is formed to reduce the risk of counterdoping the horizontally-oriented lightly doped regions 622 where Schottky contacts will be formed.

Processing continues substantially as described in the embodiments of FIGS. 14 to 24. Contact openings 3922, one of which is illustrated in FIG. 40, are formed through the ILD layer 1902 and insulating layer 3912 to expose the horizontally-oriented lightly doped regions 622, one of which is illustrate in FIG. 40. The etch does not proceed through the entire thickness of the horizontally-oriented lightly doped region 622. The conductive plug 2924 is formed substantially as previously described. The metal silicide 3222 contacts the upper surface of the horizontally-oriented lightly doped region 622. During operation, the doped region 3904 helps to keep the current flowing laterally along the horizontally-oriented lightly doped region 622.

The electronic components described above may be integrated onto a single die. In another embodiment, a plurality of dies may be used. For example, the high-side transistor structures and Schottky contact in FIG. 37 may be on the same die, the low-side transistor structures and the Schottky contact in FIG. 38 may be on a different die, and the control unit 16 may be on a further die. In another embodiment, the high-side transistor 12, the low-side transistor 14, and the Schottky diodes 13 and 15 may be on the same die, and the control unit may be on another die. In a further embodiment, a portion of the control unit 16, such as the circuit 166, may be on the same die with the high-side transistor 12, and another portion of the control unit 16 may be on a different die that also has the low-side transistor 14. After reading this specification, skilled artisans will be able to arrange the components on one or more dies for a particular application.

In still another embodiment, one or more bipolar transistors may be used instead of the field-effect transistors. In this embodiment, current carrying electrodes can include emitter regions and collector regions instead of the source regions and drain regions, and control electrodes can include base regions instead of gate electrodes. An emitter of a high-side bipolar transistor can be electrically connected to a collector of a low-side bipolar transistor. If a buried collector is used, the buried collector can be patterned to allow a properly isolated connection to be made to the buried conductive region 202. The Schottky contacts can be integrated into the process flow and occupy a relatively small amount of area.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a first semiconductor layer having a first primary surface; and a Schottky contact including a first metal-containing member in contact with a horizontally-oriented lightly doped region within the first semiconductor layer and lying adjacent to the first primary surface, wherein the first metal-containing member lies within a recess in the first semiconductor layer and contacts the horizontally-oriented lightly doped region along a sidewall of the recess.

Item 2. The electronic device of Item 1, wherein the horizontally-oriented lightly doped region is N-type doped.

Item 3. The electronic device of Item 1, further including an ohmic contact including the first metal-containing member in contact with a first heavily-doped region at an elevation below the horizontally-oriented lightly doped region, wherein the first heavily-doped region has a conductivity type opposite to a conductivity type of the horizontally-oriented lightly doped region.

Item 4. The electronic device of Item 3, further including a first resurf region lying below the horizontally-oriented lightly doped region and adjacent to the first heavily doped region, wherein the first resurf region and the first heavily doped region have a same conductivity type.

Item 5. The electronic device of Item 1, further including a first buried conductive region spaced apart from the first primary surface, and a first vertical conductive region coupled to the first buried conductive region and the horizontally-oriented lightly doped region.

Item 6. The electronic device of Item 5, further including a first power transistor having a first current-carrying region and a second current-carrying region, wherein the first current-carrying region is coupled to the first metal-containing member, and the second current-carrying region is coupled to the first buried conductive region.

Item 7. The electronic device of Item 6, wherein a Schottky diode includes the Schottky contact, and the Schottky diode is electrically connected in parallel with the first power transistor.

Item 8. The electronic device of Item 7, further including a second semiconductor layer having a second primary surface, a second buried conductive region spaced apart from the second primary surface, a second vertical conductive region coupled to the second buried conductive region, and a second power transistor having a first current-carrying region, wherein the first current-carrying electrode of the second power transistor is coupled to the second buried conductive region.

Item 9. The electronic device of Item 8, wherein the first and second semiconductor layers are different semiconductor layers that are on different dies, and the first and second primary surfaces are different primary surfaces that are on different dies.

Item 10. The electronic device of Item 8, wherein the first and second semiconductor layers are a same semiconductor layer, and the first and second primary surfaces are a same primary surface.

Item 11. The electronic device of Item 1, further including a conductive electrode overlying the horizontally-oriented lightly doped region and electrically coupled to the metal-containing member of the Schottky contact.

Item 12. The electronic device of Item 11, wherein the conductive electrode is electrically connected to and spaced apart from the metal-containing member of the Schottky contact.

Item 13. The electronic device of Item 11, wherein the conductive electrode contacts the metal-containing member of the Schottky contact.

Item 14. The electronic device of Item 11, wherein a first power transistor includes a gate electrode and a drain region that includes the horizontally-oriented lightly doped region, and the conductive electrode is configured to reduce drain-to-gate capacitance within the first power transistor, as compared to the conductive electrode being replaced by an insulating material.

Item 15. The electronic device of Item 11, further including an insulating layer between the conductive electrode and the horizontally-oriented lightly doped region, wherein the insulating layer has a thickness no greater than 0.2 micron.

Item 16. An electronic device can include a buried conductive region, a semiconductor layer overlying the buried conductive region and having a primary surface spaced apart from the buried conductive region; a Schottky contact including a metal-containing member in contact with a horizontally-oriented lightly doped region lying adjacent to the primary surface, wherein the horizontally-oriented lightly doped region has a first dopant type; a vertical conductive structure extending at least partly through the semiconductor layer and coupled to the horizontally-oriented lightly doped region and the buried conductive region; and a doped region below and spaced apart from the Schottky contact, wherein the doped region is laterally spaced apart from the vertical conductive structure, has a second conductivity type opposite the first conductivity type, and has a dopant concentration of at least approximately $5 \times 10^{17}$ atoms/cm$^3$.

Item 17. The electronic device of Item 16, wherein from a top view, a gate electrode does not overlie the horizontally-oriented lightly doped region at any location along a line corresponding to a shortest distance between the metal-containing member and the vertical conductive structure.

Item 18. An electronic device can include a Schottky diode including a cathode including a horizontally-oriented lightly doped N-type region lying adjacent to a primary surface of a semiconductor layer, and an anode including a metal-containing member that contacts the horizontally-oriented lightly doped N-type region. The electronic device can further include a buried conductive region spaced apart from the primary surface, and a vertical conductive structure coupled to the metal-containing member and the buried conductive region.

Item 19. The electronic device of Item 18, further including a power transistor coupled to the Schottky diode.

Item 20. The electronic device of Item 19, wherein the power transistor includes an insulated gate field-effect transistor having a source region that is electrically connected to the anode of the Schottky diode via the buried conductive region.

Item 21. The electronic device of Item 19, wherein the power transistor includes an insulated gate field-effect transistor having a drain region that is electrically connected to the anode of the Schottky diode.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a first semiconductor layer having a first primary surface;
   a first power transistor comprising a gate electrode and a drain region that includes a horizontally-oriented lightly doped region within the first semiconductor layer and lying adjacent to the first primary surface;
   a Schottky contact comprising a first metal-containing member in contact with the horizontally-oriented lightly doped region; and
   a conductive electrode overlying the horizontally-oriented lightly doped region and electrically coupled to the metal-containing member of the Schottky contact, wherein the first power transistor with the conductive electrode has a lower drain-to-gate capacitance, as compared to the transistor when the conductive electrode is replaced by an insulating material.

2. The electronic device of claim 1, wherein the first metal-containing member lies within a recess in the first semiconductor layer and contacts the horizontally-oriented lightly doped region along a sidewall of the recess.

3. The electronic device of claim 2, further comprising an ohmic contact comprising the first metal-containing member in contact with a first heavily-doped region at an elevation below the horizontally-oriented lightly doped region, wherein the first heavily-doped region has a conductivity type opposite to a conductivity type of the horizontally-oriented lightly doped region.

4. The electronic device of claim 3, further comprising a first resurf region lying below the horizontally-oriented lightly doped region and adjacent to the first heavily doped region, wherein the first resurf region and the first heavily doped region have a same conductivity type.

5. The electronic device of claim 1, further comprising:
   a first buried conductive region spaced apart from the first primary surface; and
   a first vertical conductive region coupled to the first buried conductive region and the horizontally-oriented lightly doped region.

6. The electronic device of claim 5, wherein the first power transistor further comprises a source region that is electrically connected to the first metal-containing member.

7. The electronic device of claim 6, wherein:
   a Schottky diode comprises the Schottky contact; and
   the Schottky diode is electrically connected in parallel with the first power transistor.

8. The electronic device of claim 7, further comprising:
   a second semiconductor layer having a second primary surface;
   a second buried conductive region spaced apart from the second primary surface;
   a second vertical conductive region coupled to the second buried conductive region; and
   a second power transistor having a first current-carrying region, wherein the first current-carrying electrode of the second power transistor is coupled to the second buried conductive region.

9. The electronic device of claim 8, wherein:
   the first and second semiconductor layers are different semiconductor layers that are on different dies; and
   the first and second primary surfaces are different primary surfaces that are on different dies.

10. The electronic device of claim 8, wherein:
    the first and second semiconductor layers are a same semiconductor layer; and
    the first and second primary surfaces are a same primary surface.

11. The electronic device of claim 1, wherein the conductive electrode is electrically connected to and spaced apart from the metal-containing member of the Schottky contact.

12. The electronic device of claim 1, wherein the conductive electrode contacts the metal-containing member of the Schottky contact.

13. The electronic device of claim 1, further comprising an insulating layer between the conductive electrode and the horizontally-oriented lightly doped region, wherein the insulating layer has a thickness no greater than 0.2 micron.

14. An electronic device comprising:
    a Schottky diode comprising:
      a cathode comprising a horizontally-oriented lightly doped N-type region lying adjacent to a primary surface of a semiconductor layer; and
      an anode comprising a metal-containing member that contacts the horizontally-oriented lightly doped N-type region;
    a buried conductive region spaced apart from the primary surface;
    a power transistor coupled to the Schottky diode, wherein the power transistor includes an insulating gate field-effect transistor having a source region and a drain region; and
    a vertical conductive structure coupled to the metal-containing member and the buried conductive region,
    wherein:
      the source region is electrically connected to the anode of the Schottky diode via the buried conductive region; or
      the drain region is electrically connected to the anode of the Schottky diode.

15. The electronic device of claim 14, wherein the source region is electrically connected to the anode of the Schottky diode via the buried conductive region.

16. The electronic device of claim 14, wherein the drain region is electrically connected to the anode of the Schottky diode.

17. The electronic device of claim 1, wherein the horizontally-oriented lightly doped region is N-type doped.

18. An electronic device comprising:
   a first semiconductor layer having a first primary surface;
   a Schottky contact comprising a first metal-containing member in contact with a horizontally-oriented lightly doped region within the first semiconductor layer and lying adjacent to the first primary surface, wherein the first metal-containing member lies within a recess in the first semiconductor layer and contacts the horizontally-oriented lightly doped region along a sidewall of the recess; and
   a conductive electrode overlying the horizontally-oriented lightly doped region and electrically coupled to the metal-containing member of the Schottky contact, wherein the conductive electrode contacts the metal-containing member of the Schottky contact.

19. The electronic device of claim 18, wherein the conductive electrode is spaced apart from the horizontally-oriented lightly doped region.

* * * * *